(12) United States Patent
Kobayashi et al.

(10) Patent No.: US 10,431,429 B2
(45) Date of Patent: Oct. 1, 2019

(54) SYSTEMS AND METHODS FOR RADIAL AND AZIMUTHAL CONTROL OF PLASMA UNIFORMITY

(71) Applicant: Applied Materials, Inc., Santa Clara, CA (US)

(72) Inventors: Satoru Kobayashi, Sunnyvale, CA (US); Hideo Sugai, Kasugai (JP); Nikolai Kalnin, Belmont, CA (US); Soonam Park, Sunnyvale, CA (US); Toan Tran, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 381 days.

(21) Appl. No.: 15/424,488

(22) Filed: Feb. 3, 2017

(65) Prior Publication Data

US 2018/0226230 A1    Aug. 9, 2018

(51) Int. Cl.
*H01J 37/32*    (2006.01)
*H01L 21/67*    (2006.01)

(52) U.S. Cl.
CPC .... *H01J 37/32229* (2013.01); *H01J 37/3244* (2013.01); *H01J 37/3299* (2013.01);
(Continued)

(58) Field of Classification Search
CPC .. H01J 37/32; H01J 37/3299; H01J 37/32302; H01J 37/32229;
(Continued)

(56) References Cited

U.S. PATENT DOCUMENTS 2,369,620 A    2/1945    Sullivan et al.
3,401,302 A    9/1968    Thorpe
(Continued)

FOREIGN PATENT DOCUMENTS

CN    1124364 A    6/1996
CN    1847450 A    10/2006
(Continued)

OTHER PUBLICATIONS

International Search Report and Written Opinion of PCT/US2017/047209 dated Nov. 24, 2017, all pages.
(Continued)

*Primary Examiner* — Thai Pham
(74) *Attorney, Agent, or Firm* — Kilpatrick Townsend & Stockton LLP

(57) ABSTRACT

A system includes a process chamber, a housing that defines a waveguide cavity, and a first conductive plate within the housing. The first conductive plate faces the process chamber. The system also includes one or more adjustment devices that can adjust at least a position of the first conductive plate, and a second conductive plate, coupled with the housing, between the waveguide cavity and the process chamber. Electromagnetic radiation can propagate from the waveguide cavity into the process chamber through apertures in the second conductive plate. The system also includes a dielectric plate that seals off the process chamber from the waveguide cavity, and one or more electronics sets that transmit the electromagnetic radiation into the waveguide cavity. A plasma forms when at least one process gas is within the chamber, and the electromagnetic radiation propagates into the process chamber from the waveguide cavity.

20 Claims, 18 Drawing Sheets

(52) U.S. Cl.
CPC ... *H01J 37/32302* (2013.01); *H01J 37/32311* (2013.01); *H01L 21/67069* (2013.01)

(58) Field of Classification Search
CPC . H01J 37/32311; H01J 37/3244; H01L 21/67; H01L 21/67069
See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desilets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |

(56) References Cited

U.S. PATENT DOCUMENTS

| | | |
|---|---|---|
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,597,439 A | 1/1997 | Salzman |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,868,897 A | 2/1999 | Ohkawa |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,928,528 A | 7/1999 | Kubota et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,963,840 A | 10/1999 | Xia et al. |
| 5,968,379 A | 10/1999 | Zhao et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,649 A | 12/1999 | Hillman |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,019,848 A | 2/2000 | Kiyama et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |

(56) References Cited

U.S. PATENT DOCUMENTS

| | | |
|---|---|---|
| 6,065,424 A | 5/2000 | Shacham-Diamand et al. |
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,780 A | 6/2000 | Dubin |
| 6,079,356 A | 6/2000 | Umotoy et al. |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,132,512 A | 10/2000 | Horie et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,233,582 B1 | 5/2001 | Williams et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,242,360 B1 | 6/2001 | Fischer et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,308,654 B1 | 10/2001 | Schneider et al. |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |

(56) References Cited

U.S. PATENT DOCUMENTS

| | | |
|---|---|---|
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fischer |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |

(56) References Cited

U.S. PATENT DOCUMENTS

| | | |
|---|---|---|
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,906,818 B2 | 3/2011 | Pekny |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,343,306 B2 | 1/2013 | Tanaka et al. |
| 8,357,435 B2 | 1/2013 | Lubomirsky |
| 8,361,892 B2 | 1/2013 | Tam et al. |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |

(56) References Cited

U.S. PATENT DOCUMENTS

| | | |
|---|---|---|
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 * | 6/2015 | Ikeda ............ H01J 37/32192 |
| 9,093,371 B2 | 7/2015 | Wang et al. |
| 9,093,389 B2 | 7/2015 | Nemani |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhange et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,343,358 B1 | 9/2016 | Montgomery |
| 9,437,451 B2 | 9/2016 | Chen et al. |
| 9,443,749 B2 | 9/2016 | Smith |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,812,462 B1 | 11/2017 | Pang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |
| 9,947,549 B1 | 4/2018 | Park et al. |
| 9,960,045 B1 | 5/2018 | Purayath et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 10,147,736 B2 | 12/2018 | Linuma |
| 2001/0006093 A1 | 7/2001 | Tabuchi |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |

(56) References Cited

U.S. PATENT DOCUMENTS

| | | |
|---|---|---|
| 2001/0042512 A1 | 11/2001 | Xu et al. |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2002/0000202 A1 | 1/2002 | Yuda et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O-Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000647 A1 | 1/2003 | Yudovsky et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wange et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144490 A1 | 7/2004 | Zhao et al. |

(56) References Cited

U.S. PATENT DOCUMENTS

| | | |
|---|---|---|
| 2004/0147126 A1 | 7/2004 | Yamashita et al. |
| 2004/0149223 A1 | 8/2004 | Collison et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0263827 A1 | 12/2004 | Xu |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1* | 5/2005 | Suzuki ............... C23C 16/45508 118/723 MW |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217582 A1 | 9/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |

(56) References Cited

U.S. PATENT DOCUMENTS

| | | |
|---|---|---|
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0017104 A1 | 1/2008 | Matyushkin et al. |
| 2008/0020570 A1 | 1/2008 | Naik |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fisher et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Su |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0036292 A1 | 2/2009 | Sun et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120464 A1 | 5/2009 | Rasheed et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |

(56) References Cited

U.S. PATENT DOCUMENTS

| | | |
|---|---|---|
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0214825 A1 | 8/2009 | Sun et al. |
| 2009/0223928 A1 | 9/2009 | Colpo |
| 2009/0236314 A1* | 9/2009 | Chen ............ H01J 37/32091 216/67 |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0286405 A1 | 11/2009 | Okesaku et al. |
| 2009/0317978 A1 | 11/2009 | Higashi |
| 2009/0293809 A1 | 12/2009 | Cho et al. |
| 2009/0294898 A1 | 12/2009 | Feustel et al. |
| 2009/0320756 A1 | 12/2009 | Tanaka |
| 2010/0000683 A1 | 1/2010 | Kadkhodayan et al. |
| 2010/0003824 A1 | 1/2010 | Kadkhodayan et al. |
| 2010/0006543 A1 | 1/2010 | Sawada et al. |
| 2010/0022030 A1 | 1/2010 | Ditizio |
| 2010/0025370 A1 | 2/2010 | Dieguez-Campo et al. |
| 2010/0039747 A1 | 2/2010 | Sansoni |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207195 A1 | 8/2010 | Fukuzumi et al. |
| 2010/0207205 A1 | 8/2010 | Grebs et al. |
| 2010/0213172 A1 | 8/2010 | Wilson |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0248488 A1 | 9/2010 | Agarwal et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0330814 A1 | 12/2010 | Yokota et al. |
| 2011/0005607 A1 | 1/2011 | Desbiolles et al. |
| 2011/0005684 A1* | 1/2011 | Hayami ............ H01J 37/321 156/345.35 |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0042799 A1 | 2/2011 | Kang et al. |
| 2011/0045676 A1 | 2/2011 | Park |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0100489 A1 | 5/2011 | Orito |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0304078 A1 | 12/2011 | Lee et al. |
| 2012/0003782 A1 | 1/2012 | Byun et al. |

(56) References Cited

U.S. PATENT DOCUMENTS

| | | |
|---|---|---|
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0091108 A1 | 4/2012 | Lin et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |
| 2012/0322015 A1 | 12/2012 | Kim |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023124 A1 | 1/2013 | Nemani et al. |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0133578 A1 | 5/2013 | Hwang |
| 2013/0150303 A1 | 6/2013 | Kungl et al. |
| 2013/0155568 A1 | 6/2013 | Todorow et al. |
| 2013/0161726 A1 | 6/2013 | Kim et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0057447 A1 | 2/2014 | Yang et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0076234 A1 | 3/2014 | Kao et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0124364 A1 | 5/2014 | Yoo et al. |
| 2014/0134842 A1 | 5/2014 | Zhange et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0152312 A1 | 6/2014 | Snow et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0175534 A1 | 6/2014 | Kofuji et al. |
| 2014/0186772 A1 | 7/2014 | Pohlers et al. |
| 2014/0190410 A1 | 7/2014 | Kim |

(56) References Cited

U.S. PATENT DOCUMENTS

| | | |
|---|---|---|
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0251956 A1 | 9/2014 | Jeon et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264507 A1 | 9/2014 | Lee et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1* | 12/2014 | Ikeda ............ H05H 1/46 315/34 |
| 2014/0363977 A1 | 12/2014 | Morimoto et al. |
| 2014/0363979 A1 | 12/2014 | Or et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170811 A1* | 6/2015 | Tanigawa ............ C04B 35/26 75/233 |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270105 A1* | 9/2015 | Kobayashi ........ H01J 37/32201 315/34 |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0380419 A1 | 12/2015 | Gunji-Yoneoka et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0064212 A1 | 3/2016 | Thedjoiswuro et al. |
| 2016/0064233 A1 | 3/2016 | Wang et al. |
| 2016/0079062 A1 | 3/2016 | Zheng et al. |
| 2016/0079072 A1 | 3/2016 | Wang et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0104606 A1 | 4/2016 | Park et al. |
| 2016/0104648 A1* | 4/2016 | Park ............ C23C 16/45536 438/9 |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |

(56) References Cited

U.S. PATENT DOCUMENTS

| | | |
|---|---|---|
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0203958 A1 | 7/2016 | Arase et al. |
| 2016/0204009 A1 | 7/2016 | Nguyen et al. |
| 2016/0218018 A1 | 7/2016 | Lieu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240353 A1 | 8/2016 | Nagami |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0343548 A1 | 11/2016 | Howald et al. |
| 2016/0358793 A1 | 12/2016 | Okumura et al. |
| 2017/0011922 A1 | 1/2017 | Tanimura et al. |
| 2017/0040175 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0133202 A1 | 5/2017 | Berry |
| 2017/0178894 A1 | 6/2017 | Stone et al. |
| 2017/0178899 A1 | 6/2017 | Kabansky et al. |
| 2017/0178924 A1 | 6/2017 | Chen et al. |
| 2017/0207088 A1 | 7/2017 | Kwon et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236694 A1 | 8/2017 | Eason et al. |
| 2017/0250193 A1 | 8/2017 | Huo |
| 2017/0294445 A1 | 10/2017 | Son et al. |
| 2017/0309509 A1 | 10/2017 | Tran et al. |
| 2017/0338133 A1 | 11/2017 | Tan et al. |
| 2017/0338134 A1 | 11/2017 | Tan et al. |
| 2018/0005850 A1 | 1/2018 | Citla et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0223437 A1 | 8/2018 | George et al. |
| 2018/0226223 A1 | 8/2018 | Lubomirsky |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-008278 A | 2/2000 |
| KR | 10-2000-0064946 A | 11/2000 |
| KR | 10-2001-0056735 A | 7/2001 |
| KR | 2003-0023964 A | 3/2003 |
| KR | 10-2003-0054726 A | 7/2003 |
| KR | 10-2003-0083663 A | 10/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |

(56) References Cited

FOREIGN PATENT DOCUMENTS

| | | | |
|---|---|---|---|
| KR | 10-2008-0063988 A | 7/2008 |
| KR | 10-0843236 B1 | 7/2008 |
| KR | 10-2009-0040869 A | 4/2009 |
| KR | 10-2009-0128913 A | 12/2009 |
| KR | 10-2010-0013980 A | 2/2010 |
| KR | 10-2010-0093358 A | 8/2010 |
| KR | 10-2011-0086540 A | 7/2011 |
| KR | 10-2011-0114538 A | 10/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A1 | 8/2011 |
| TW | 2012-07619 | 2/2012 |
| TW | 2012-13594 A | 4/2012 |
| TW | 2012-33842 A1 | 8/2012 |
| WO | 2008-112673 A2 | 9/2008 |
| WO | 2009-009611 A2 | 1/2009 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A1 | 6/2011 |
| WO | 2011-095846 A1 | 8/2011 |
| WO | 2011-149638 A | 12/2011 |
| WO | 2012-050321 A | 4/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

OTHER PUBLICATIONS

International Search Report and Written Opinion of PCT/US2017/033362 dated Aug. 24, 2017, all pages.
Won et al. Derwent 2006-065772; Sep. 7, 2014, 10 pages.
International Search Report and Written Opinion of PCT/US2017/060696 dated Jan. 25, 2018, all pages.
International Search Report and Written Opinion of PCT/US2017/055431 dated Jan. 19, 2018, all pages.
J.J. Wang and et al., "Inductively coupled plasma etching of bulk 1-20 6H—SiC and thin-film SiCN in NF3 chemistries," Journal of Vacuum Science & Technology A: Vacuum, Surfaces, and Films 16, 2204 (1998).
H. Xiao, Introduction to Semiconductor Manufacturing Technology, published by Prentice Hall, 2001, ISBN 0-13-022404-9, pp. 354-356.
Manual No. TQMA72E1. "Bayard-Alpert Pirani Gauge FRG-730: Short Operating Instructions" Mar. 2012. Agilent Technologies, Lexington, MA 02421, USA. pp. 1-45.
International Search Report and Written Opinion of PCT/US2016/045551 dated Nov. 17, 2016, all pages.
International Search Report and Written Opinion of PCT/US2016/045543 dated Nov. 17, 2016, all pages.
"Liang et al. Industrial Application of Plasma Process vol. 3, pp. 61-74, 2010".
Instrument Manual: Vacuum Gauge Model MM200, Rev D. TELEVAC (website: www.televac.com), A Division of the Fredericks Company, Huntingdon Valley, PA, US. 2008. pp. 162.
International Search Report and Written Opinion of PCT/US2018/016261 dated May 21, 2018, all pages.
International Search Report and Written Opinion of PCT/US2018/016648 dated May 18, 2018, all pages.

\* cited by examiner

SYSTEMS AND METHODS FOR RADIAL AND AZIMUTHAL CONTROL OF PLASMA UNIFORMITY

TECHNICAL FIELD

The present disclosure is in the field of electromagnetic radiation. More specifically, embodiments that utilize waveguides and associated control systems to provide radial and/or azimuthal control of plasma in a process chamber are disclosed.

BACKGROUND

Semiconductor processing often generates plasmas to create ionized and/or energetically excited species for interaction with semiconductor wafers themselves, or other processing related materials (e.g., photoresist). To create and/or maintain a plasma, one or more radio frequency (RF) and/or microwave generators are typically utilized to generate oscillating electric and/or magnetic fields. The same fields, and/or DC fields, may also be utilized to direct the ionized and/or energetically excited species to the semiconductor wafer(s) being processed. The fields may be generated and/or coupled into a chamber where the plasma is generated in a variety of ways. Various known methods are often utilized to match an impedance of a power source (the RF generator) to a load (the plasma) so that power from the RF generator is delivered to the plasma without significant reflection of power back to the RF generator. This is for reasons of energy efficiency as well as to protect electrical components of the RF generator from damage. Particularly when microwave energy is utilized, reflected power is usually directed to a dummy load where it is dissipated as heat, which must then be removed. Thus, reflected power results in a two-fold waste of energy: the energy utilized to generate the power, and the energy utilized to remove the waste heat.

SUMMARY

In an embodiment, a system includes a process chamber, a housing that defines a waveguide cavity, and a first conductive plate within the housing. The first conductive plate faces the process chamber across the waveguide cavity. The system also includes one or more adjustment devices that can adjust at least a position of the first conductive plate, and a second conductive plate, coupled with the housing, between the waveguide cavity and the process chamber. Electromagnetic radiation can propagate from the waveguide cavity into the process chamber through apertures in the second conductive plate. The system also includes a dielectric plate that seals off the process chamber from the waveguide cavity such that the waveguide cavity is not evacuated when the process chamber is evacuated. The system further includes one or more electronics sets that transmit the electromagnetic radiation into the waveguide cavity. A plasma forms when at least one process gas is within the chamber, and the electromagnetic radiation propagates into the process chamber from the waveguide cavity.

In an embodiment, a plasma processing system includes a process chamber that is operable to be evacuated, one or more process gas supplies for introducing one or more process gases into the process chamber, a housing that defines a waveguide cavity, and one or more electronics sets that can transmit electromagnetic radiation into the waveguide cavity. Each of the one or more electronics sets matches its driving impedance to an impedance presented by the waveguide cavity to the electromagnetic radiation. A first conductive plate is within the housing and on a distal side of the waveguide cavity from the process chamber. At least three adjustment devices couple with the first conductive plate and the housing. The adjustment devices can adjust at least a position of the first conductive plate within a range of positions, and a tilt of the first conductive plate with respect to the housing. A second conductive plate is coupled with the housing and interposed between the waveguide cavity and the process chamber. The second conductive plate forms a plurality of apertures therein for allowing electromagnetic radiation within the waveguide cavity to propagate, through the apertures, into the process chamber. A dielectric plate seals off the process chamber from the waveguide cavity such that the waveguide cavity is not evacuated when the process chamber is evacuated. The waveguide cavity can support an eigenmode between the first and second conductive plates when the first conductive plate is adjusted to an eigenmode position within the range of positions, and the one or more electronics sets transmit the electromagnetic radiation into the waveguide cavity. The plasma forms when at least one of the process gases is within the chamber, and the electromagnetic radiation propagates into the process chamber from the waveguide cavity.

In an embodiment, a method for generating a plasma for processing a workpiece includes introducing one or more process gases into a process chamber. The process chamber is at least partially sealed with a dielectric plate capable of supporting a pressure differential corresponding to evacuation of the process chamber. The method also includes propagating electromagnetic radiation into a waveguide cavity that is disposed adjacent to the process chamber. The waveguide cavity is at least partially bounded by a first conductive plate that faces the process chamber and is across the waveguide cavity from the process chamber, and a second conductive plate between the waveguide cavity and the dielectric plate. The second conductive plate forms apertures that allow the electromagnetic radiation to propagate through the second conductive plate, through the dielectric plate and into the chamber. The method further includes igniting the plasma from the process gases, and sustaining the plasma with power supplied by the electromagnetic radiation propagated into the process chamber through the apertures of the second conductive plate.

In an embodiment, a method for providing electromagnetic radiation for powering a plasma in a process chamber includes introducing one or more process gases into the process chamber, and propagating electromagnetic radiation from at least two locations P and Q, into a waveguide cavity that is disposed adjacent to the process chamber. The waveguide cavity is separated from the process chamber such that the process chamber can be evacuated without evacuating the waveguide cavity, yet electromagnetic radiation within the waveguide cavity can propagate into the process chamber. The locations P and Q are disposed at respective angles $\theta_p$ and $\theta_q$ about a circumference of the waveguide cavity. The electromagnetic radiation is provided at a microwave frequency $\omega$ with a rotation frequency $\Omega$ within the waveguide cavity. The method further includes igniting the plasma from the process gases, and sustaining the plasma with power supplied by the electromagnetic radiation propagated from the waveguide cavity into the process chamber.

In an embodiment, a system that generates a plasma includes a process chamber that can be evacuated, and a waveguide cavity disposed adjacent to the process chamber.

The waveguide cavity is separated from the process chamber without blocking electromagnetic radiation within the waveguide cavity from propagating into the process chamber. The system also includes one or more process gas supplies for introducing one or more process gases into the process chamber, and a first electronics set and a second electronics set. Each of the first and second electronics sets transmits electromagnetic radiation into the waveguide cavity. The system further includes a controller that provides respective first and second input waveforms to each of the first and second electronics sets. Each of the first and second input waveforms has a microwave frequency co, and the first and second input waveforms have respective amplitudes that, when amplified by the electronics sets, provide the electromagnetic radiation within the waveguide cavity with a rotation frequency $\Omega$. The plasma forms when at least one of the one or more process gases is within the chamber, and the electromagnetic radiation propagates into the process chamber from the waveguide cavity.

In an embodiment, a method for plasma processing in a process chamber includes introducing one or more process gases into the process chamber. The process chamber is disposed adjacent to a waveguide cavity, and the waveguide cavity is separated from the process chamber without blocking electromagnetic radiation within the waveguide cavity from propagating into the process chamber. The method also includes propagating electromagnetic radiation into the waveguide cavity. The electromagnetic radiation is provided at a microwave frequency co. A first portion of power supplied within the waveguide cavity is supplied by a portion of the electromagnetic radiation that resonates in a TE mode within the waveguide cavity. A second portion of power supplied within the waveguide cavity is supplied by a portion of the electromagnetic radiation that resonates in a second TE mode within the waveguide cavity. The method further includes igniting the plasma from the process gases; and sustaining the plasma with power supplied by the electromagnetic radiation propagated from the waveguide cavity into the process chamber.

In an embodiment, a method for processing a workpiece in a process chamber includes placing the workpiece in the process chamber. The process chamber is disposed adjacent to a waveguide cavity. The waveguide cavity is separated from the process chamber without blocking electromagnetic radiation within the waveguide cavity from propagating into the process chamber. The method also includes processing the workpiece with a first plasma, and processing the workpiece with a second plasma. Each of the first and second plasmas are produced by introducing one or more process gases into the process chamber, propagating electromagnetic radiation into the waveguide cavity, igniting the plasma from the process gases, and sustaining the plasma with power supplied by the electromagnetic radiation propagated from the waveguide cavity into the process chamber. At least a portion of power for the first plasma is supplied by the electromagnetic radiation resonating in a first TE mode within the waveguide cavity, and at least a portion of power for the second plasma is supplied by the electromagnetic radiation resonating in a second TE mode within the waveguide cavity. The first TE mode is of a different order than the second TE mode.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification. One of ordinary skill in the art, upon reading and comprehending the present disclosure, will be able to practice not only the specifically described concepts, but will readily recognize alternatives, equivalents, modifications, and intermediate combinations of the disclosed features, all of which are within the scope of the disclosure.

BRIEF DESCRIPTION OF THE DRAWINGS

The present disclosure may be understood by reference to the following detailed description taken in conjunction with the drawings briefly described below, wherein like reference numerals are used throughout the several drawings to refer to similar components. It is noted that, for purposes of illustrative clarity, certain elements in the drawings may not be drawn to scale. Specific instances of an item may be referred to by use of a numeral in parentheses (e.g., monitoring antennas 211(1), 211(2)) while numerals without parentheses refer to any such item (e.g., monitoring antennas 211). In instances where multiple instances of an item are shown, only some of the instances may be labeled, for clarity of illustration.

DETAILED DESCRIPTION

Figure 1:
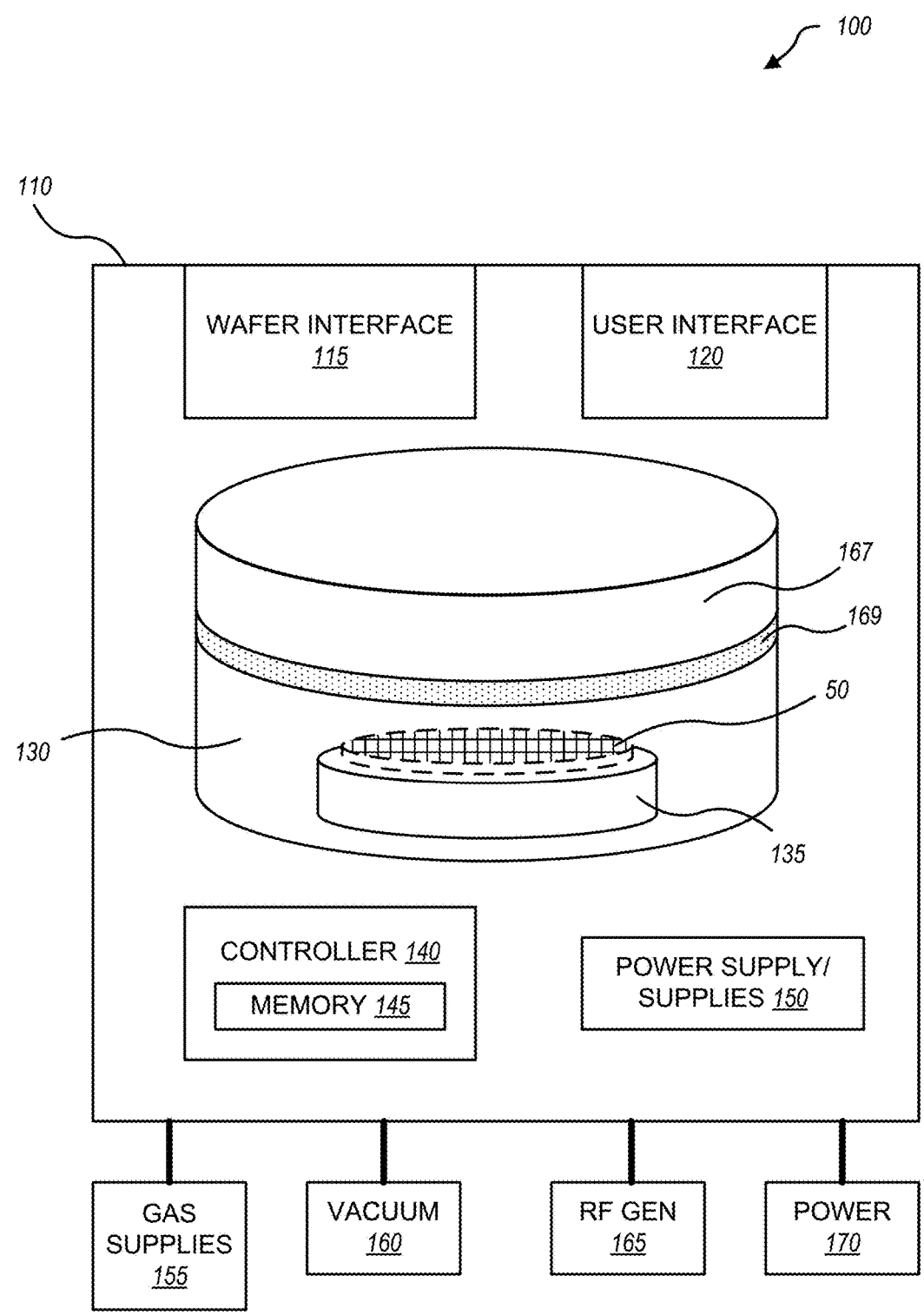
FIG. 1 schematically illustrates major elements of a plasma processing system, according to an embodiment.
Figure 2A:
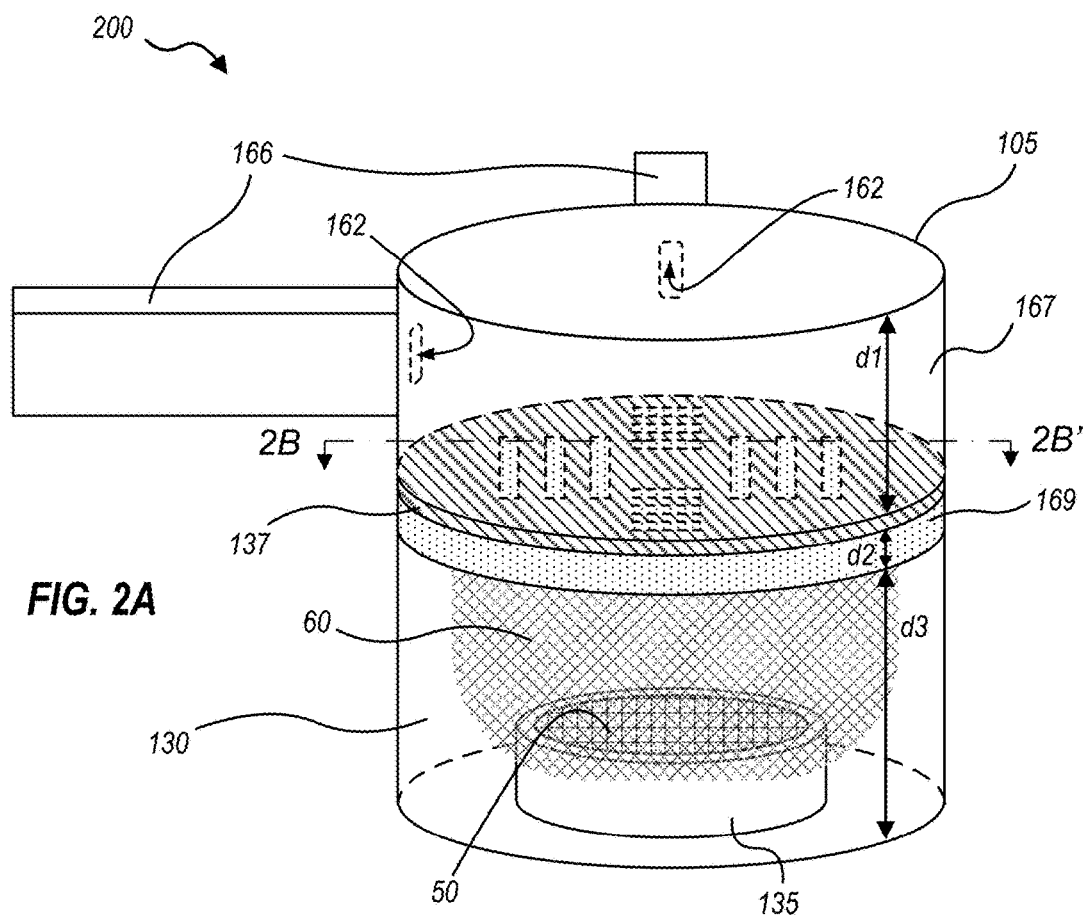
FIG. 2A is a schematic, isometric view illustrating a portion of a plasma processing system, according to an embodiment.

FIG. 1 schematically illustrates major elements of a plasma processing system 100, according to an embodiment. System 100 is depicted as a single wafer, semiconductor wafer processing system, but it will be apparent to one skilled in the art that the techniques and principles herein are applicable to a plasma processing system for any type of workpiece (e.g., items that are not necessarily wafers or semiconductors). Processing system 100 includes an outer housing 110 for a wafer interface 115, a user interface 120, a process chamber 130, a controller 140 and one or more power supplies 150. Process chamber 130 includes one or more pedestals 135, upon which wafer interface 115 can place a workpiece 50 (e.g., a wafer, but could be a different type of workpiece) for processing. Vacuum 160 (e.g., one or more vacuum pumps) are operable to evacuate process chamber 130, and one or more gas supplies 155 can be connected to introduce process gases into process chamber 130. One or more radio frequency or microwave generators (RF Gen) 165 supply power at one or more radio or microwave frequencies to create a plasma within process chamber 130. (The electromagnetic radiation provided by embodiments herein may be called "microwaves" in this disclosure, notwithstanding that the radiation may be within the microwave, radio frequency or other portions of the electromagnetic spectrum.) RF Gen 165 may be external or internal to system 100, and may take the form of one or more electronics sets, described further below. RF Gen 165 transmits microwaves within a waveguide cavity 167 that may be disposed above or below process chamber 130, and is shown in FIGS. 1 and 2A as above chamber 130. Waveguide cavity 167 may be a cylindrical cavity, but this is not strictly required. Process chamber 130 is proximate waveguide cavity 167, and is bounded adjacent to waveguide cavity 167 by at least a plate 169 formed of a dielectric material that is permeable to microwaves, but not to air or process gases utilized in chamber 130. Thus, dielectric plate 169 can support a pressure difference between waveguide cavity 167 and chamber 130 when chamber 130 is evacuated, while allowing microwaves within waveguide cavity 167 to propagate into chamber 130. Dielectric plate 169 may be formed, for example, of refractory material(s) such as silicon dioxide, silicon nitride or intermediate silicon oxynitride compounds; ceramic(s) such as alumina, yttria and the like; plastic(s) and/or polymer(s). In some embodiments, a plurality of hollowed regions is formed on a lower surface of dielectric plate 169. This can help plasma ignition, especially in relatively high pressure (e.g., about 1 Torr or greater) or low power conditions, by helping to disrupt plasma surface modes that can form at the lower surface of dielectric plate 169. Other structures may also exist between waveguide cavity 167 and process chamber 130, as discussed below.

The elements shown as part of system 100 are listed by way of example and are not exhaustive. Many other possible elements, such as: gas and/or vacuum plumbing, pressure and/or flow controllers; electrodes, magnetic cores and/or other electromagnetic apparatus; mechanical, pressure, temperature, chemical, optical and/or electronic sensors; viewing and/or other access ports; and the like may also be included, but are not shown for clarity of illustration. Internal connections and cooperation of the elements shown within system 100 are also not shown for clarity of illustration. In addition to RF generator 165, other utilities such as gas supplies 155, vacuum 160, and/or general purpose electrical power 170 may connect with system 100. Like the elements shown in system 100, the utilities shown as connected with system 100 are intended as illustrative rather than exhaustive; other types of utilities such as heating or cooling fluids, pressurized air, network capabilities, waste disposal systems and the like may also be connected with system 100, but are not shown for clarity of illustration.

Figure 2B:
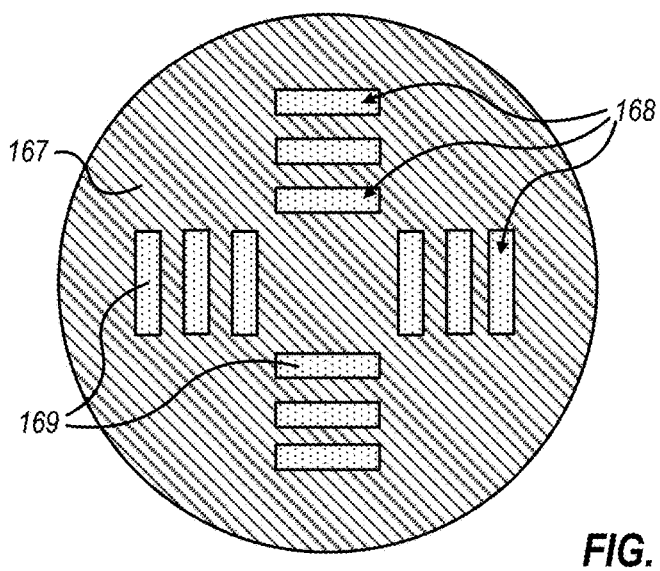
FIG. 2B is a schematic top plan view illustrating a conductive plate that forms part of the plasma processing system of FIG. 2A.

FIG. 2A is a schematic, isometric view that illustrates a portion of a plasma processing system 200 that includes a waveguide cavity 167, microwave inputs 166 that transmit microwaves into waveguide cavity 167, a process chamber 130, and a workpiece 50 therein. A broken line 2B-2B' indicates a plane of a cross-sectional view illustrated in FIG. 2B. In system 200, a housing 105 defines both waveguide cavity 167 and process chamber 130, and process chamber 130 is substantially radially symmetric about a common axis with waveguide cavity 167. Microwaves propagate from microwave inputs 166 through microwave input openings 162 into waveguide cavity 167, then into process chamber 130 through slots 168 of a conductive plate 137, to provide energy for igniting and/or maintaining a plasma 60. Conductive plate 137 may be formed of metal, for example, but can also be formed of other conductive materials, or conductive materials that are partially or completely coated with protective (and not necessarily conductive) materials. In the embodiment shown in FIGS. 2A and 2B, waveguide cavity 167 is bounded by a dielectric plate 169 that faces, and may be in contact with, conductive plate 137. Dielectric plate 169 may be formed, for example, of refractory material(s) such as silicon dioxide, silicon nitride or intermediate compounds (e.g., silicon oxynitride); ceramic(s) such as alumina, yttria and the like; plastic(s) and/or polymer(s). Conductive plate 137 forms slots 168 that allow microwaves to propagate through dielectric plate 169 and into process chamber 130. Slots 168 may, for example, form a radial line slot antenna. Pedestal 135 is configured to present a workpiece 50 to plasma 60 for processing. Process chamber 130 may include ports and/or mechanical openings (not shown) for insertion and/or withdrawal of workpiece 50, introduction of gases to form plasma 60, removal of plasma and gaseous reaction products, sensors, viewing and the like. Conductive plate 137 may be advantageous in that it may be a good thermal conductor, to help remove heat generated by plasma 60 and by displacement currents within dielectric plate 169. FIG. 2B is a schematic top plan view illustrating conductive plate 137, showing dielectric plate 169 exposed through slots 168.

The orientation of process chambers, waveguide cavities and the like that is illustrated in FIGS. 2A, 4 and 6-10 is typical, but not required for operation of systems herein. For example, FIG. 2A shows a workpiece 50 that may be a wafer, disposed atop a pedestal 135 that may be a wafer chuck, where gravity could be used to hold the workpiece in place, at least during transfer operations. Thus, in the description below, where the term "height" is used, this should be taken to mean a position or a distance, not necessarily in a vertical direction. Similar terms like "vertical" and "top" do not limit embodiments to the orientations shown, but should be understood as modified according to other orientations in which embodiments may be operated.

Because the walls and conductive plate 137 of system 200 are equipotential planes, waveguide cavity 167 may support eigenmodes—microwave propagation modes in which, for example, a height d1 of waveguide cavity 167 is a multiple of half axial wavelengths of the microwaves within waveguide cavity 167, such that waveguide cavity 167 is resonant at the corresponding microwave frequency. That is, when d1=m2π/k$_z$, an eigenmode forms at a resonant frequency of waveguide cavity 167. Here, the axial wavenumber k$_z$ is defined as $$\left(\frac{\omega}{c}\right)^2 = \kappa^2 + k_z^2,$$

where ω is an angular frequency (ω=2πf), f is the frequency of the microwave, m is a positive integer and c is the speed of light, and K is a radial wavenumber for which a boundary condition on the side-wall of the cavity is satisfied for a radius R of the cavity (i.e., J'$_m$(Y'$_{mn}$)=0 and κ=y'$_{mn}$/R, where J'$_m$ is a Bessel function of the first kind, of order m, and y'$_{mn}$ is a Bessel function of the second kind, of order m.)

For example, in system 200, when a typical microwave frequency of 2.45 GHz is used, one value of d1 will be about 62 mm, but can vary according to shapes and patterns of slots on conductive plate 137, small variations in materials, the exact geometry of microwave input openings 162, and the like. A value of d1 that causes waveguide cavity 167 to support an eigenmode may be designated as an "eigenmode position" herein. Eigenmodes within waveguide cavity 167 advantageously maximize power delivery from the electronics sets into plasma 60, and minimize power that is reflected back to the electronics sets. (A thickness of dielectric plate 169 and a height of process chamber 130 can also be designed to support eigenmode operation of process chamber 130 at the same microwave frequency, as discussed below.)

It may also be helpful to provide dielectric plate 169 with a thickness and dielectric constant to support a resonance within dielectric plate 169 at the same frequency that supports an eigenmode within waveguide cavity 167. This can be represented as the condition d2=m2π/k$_{dz}$, where axial wavenumber k$_{dz}$ is defined as $$\left(\frac{\omega\sqrt{\varepsilon_d}}{c}\right)^2 = \kappa^2 + k_{dz}^2,$$

ε$_d$ is the dielectric constant of dielectric plate 169 (or the effective dielectric constant, if dielectric plate 169 is formed of multiple materials), m is any positive integer, and radial wavenumber K is defined above. The reason that this condition is helpful, is because to ignite plasma 60, it helps to provide high field strength just below dielectric plate 169. Plasma 60 may tend to form and/or be concentrated nearest to dielectric plate 169 within process chamber 130 (where fields coupled through plate 137 are strongest). Additionally, although overall effective height of chamber 130 may not be critical, it can also be chosen to support eigenmode operation of process chamber 130. This condition may be represented as the net "electrical height" being a multiple of the half-wavelength of microwaves to be used, to maximize electromagnetic field strength throughout process chamber 130, that is, d3+d2√ε$_d$≅m(λ/2). And, for the same reasons as noted above with respect to waveguide cavity 167, it may be difficult to ensure the eigenmode condition when conductive plate 137, dielectric plate 169 and process chamber 130 are of fixed construction.

Dimensional variations, material variations and the like of housing 105, an exact configuration of slots 168 within conductive plate 137, distribution of plasma 60 under dielectric plate 169, and/or asymmetric features such as sensors, fasteners, access ports and the like associated with waveguide cavity 167 can shift an effective value of an eigenmode position, either globally or from place to place within waveguide cavity 167. Therefore, while housing 105 and conductive plate 137 may be fabricated with an intent that d1 defines an eigenmode position, an actual value d1 may not be an eigenmode position, as intended. Apparatus and methods for adjusting d1 and other dimensions of cavities and chambers herein are disclosed below in connection with FIGS. 4-6 and FIGS. 10-12.

An optimal thickness of dielectric plate 169 may also be governed by other requirements such as cost, size, weight, mechanical strength and ability to maintain a vacuum seal over process chamber 130. Process chamber 130 may be sized to accommodate workpieces 50 that are up to 300 mm or 450 mm in diameter (e.g., wafers of about 12 inches or about 18 inches nominal diameter). Therefore, dielectric plate 169 may be required to support a vacuum pressure differential across an area of about 0.15 m$^2$ to 0.25 m$^2$, exerting a net force of about 22 to 40 pounds at normal atmospheric pressure. When dielectric plate 169 is formed of a refractory material with a dielectric constant of about 4 or a ceramic with a dielectric constant of about 10, thicknesses less than about 10 mm may be too fragile, while thicknesses greater than about 80 mm may be too costly, large and heavy. Within this exemplary range, exact thicknesses to be used can be optimized according to the wavelength of the microwave radiation to be used and the actual dielectric constant of the material to be used, as discussed above.

Figure 3:
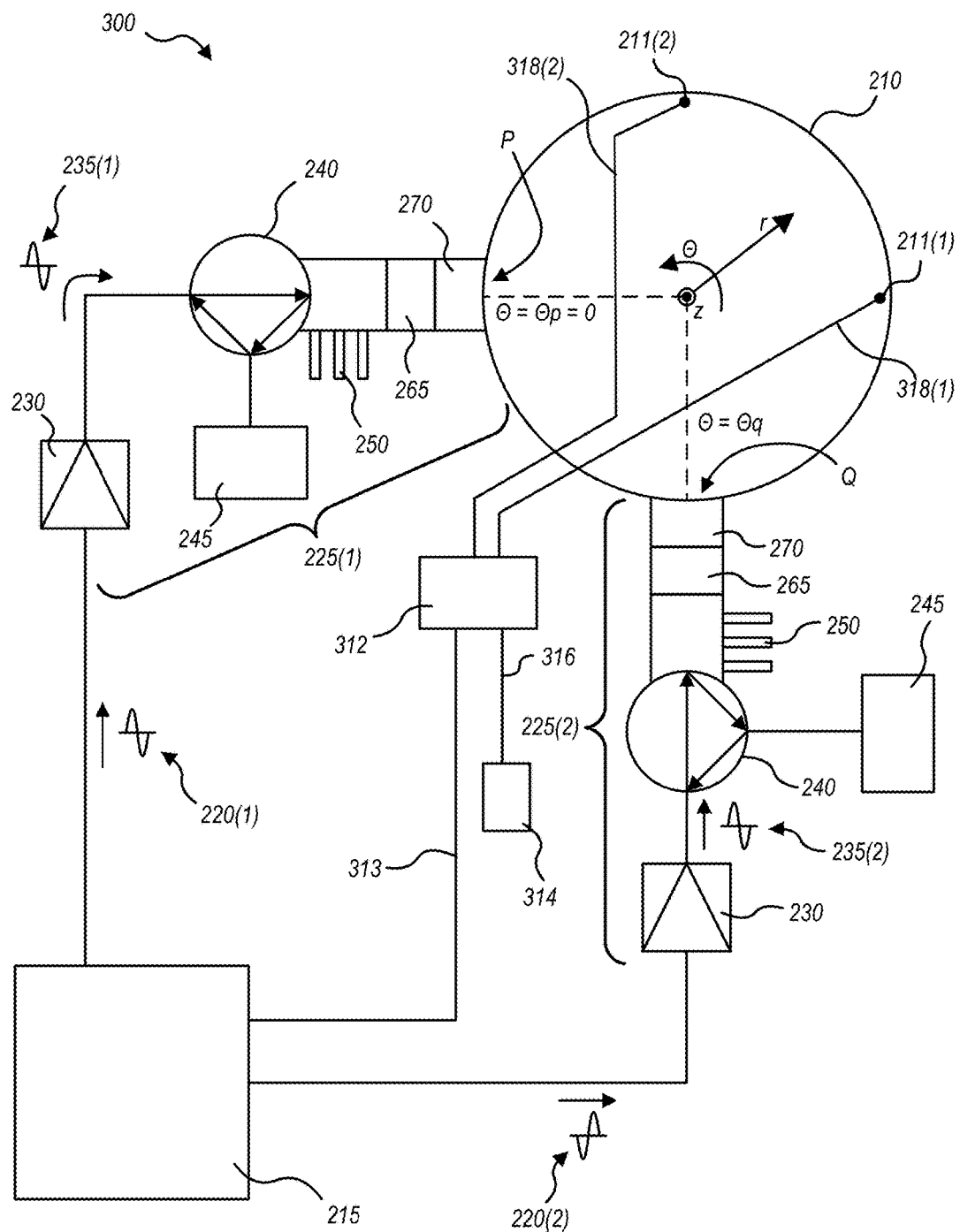
FIG. 3 is a schematic diagram illustrating major components of a system for providing microwaves to a plasma chamber utilizing a waveguide, according to an embodiment.

FIG. 3 is a schematic diagram illustrating major components of a system 300 for providing microwaves to a plasma chamber utilizing a waveguide. A waveguide 210 of system 300 may be for example waveguide cavity 167, FIGS. 1 and 2A. In general, system 300 powers waveguide 210 at two locations noted as P and Q in FIG. 3. Locations P and Q are typically driven at a common frequency (by electronics sets 225(1), 225(2), described below) with a phase offset that may correspond to the angular offset between P and Q around a circumference of waveguide 210. A coordinate reference system is shown within waveguide 210. An axial direction z denotes distance along a cylindrical axis that is concentric with waveguide 210; that is, direction z is in and out of the plane of FIG. 3. A radial direction r denotes distance from the cylindrical axis. An azimuthal direction θ denotes angular position about the cylindrical axis. Location P is taken as the origin of the θ direction, as shown.

Waveguide 210 is thus considered a dual driven waveguide; the dual driven mode of operation provides high microwave energy density derived from two sets of driving electronics rather than a single set operating at double the power. Use of two (or more) sets of driving electronics, each operating at lower power than a single set at high power, may be advantageous. An electronics set operating at higher power may require components having higher voltage, current, or heat dissipation ratings that may be much more expensive or difficult to obtain than components for lower power sets. For example, microwave field effect transistors (FETs) of low cost and high quality have recently become available for use in electronics sets 225 herein, but high voltage, current, and/or power dissipation versions of such FETs may remain costly or difficult to obtain.

Operation of system 300 is best understood as starting with a signal generator 215 that provides two microwave signals 220(1), 220(2) that are at the same frequency, but may have a phase offset with respect to one another, that may correspond to a mechanical offset between the driving locations. For example, if locations P and Q are located 90 degrees away from one another about a circumference of waveguide 210, the nominal phase offset would be $\pi/2$. Determining and controlling corrections to phase offset is discussed immediately below. In certain embodiments, signal generator 215 may control frequency and/or amplitude of signals 320, as well as phase thereof. An application of controlling frequency is to tune system 300 so that eigenmode conditions can be established in waveguide 210 and an adjacent process chamber. This can be done to correct electronically for difficult-to-control irregularities in waveguide and chamber dimensions, materials, asymmetric chamber features and the like, although mechanical approaches can also be taken (e.g., see FIGS. 4-6 and FIGS. 10-12 below). An application of controlling amplitude is to provide rotating mode control such that local irregularities in the generated plasma can be smoothed out, as discussed further below (e.g., see FIGS. 13, 14).

Microwave signals 220(1), 220(2) drive circuits that are referred to as a first electronics set 225(1) and a second electronics set 225(2). Each electronics set 225(1), 225(2) begins with a solid state amplifier 230 that boosts the power of respective microwave signals 220(1), 220(2) to create amplified microwave signals 235(1), 235(2). Solid state amplifiers 230 may include one or more microwave FETs, as discussed above. Each amplified microwave signal 235(1), 235(2) passes into and through a circulator 240 that serves to protect the respective solid state amplifiers 230 from power reflections from waveguide 210. Circulators 240 thus pass input power from solid state amplifiers 230 into respective tuners 250, while shunting any power that is reflected back into dummy loads 245.

Tuners 250 adjust impedance seen by the amplified microwave signals 235(1), 235(2) so as to match an impedance presented by components such as coaxial-to-waveguide converters 265, waveguide 210 and an adjacent process chamber (e.g., process chamber 130, FIG. 1, not shown in FIG. 3). Tuners 250 may be, for example, three-pole stub tuners. The amplified, tuned signals then pass through respective coaxial-to-waveguide converters 265 and into waveguide 210 at respective waveguides with radiating apertures 270 (corresponding to the schematically designated microwave inputs 166 ending in microwave input openings 162, FIG. 2A).

As part of the tuning required to achieve acceptable impedance matching, tuners 250 can change the phase of signals passed toward waveguide 210, such that although the signals are supplied at positions that have a mechanical phase offset around the circumference of waveguide 210, the signals themselves may no longer have the same electrical phase offset. For example, if P and Q are mechanically offset by 90 degrees, the tuners may shift the phase offset between microwaves at P and Q to a value other than $\pi/2$. Thus, instead of exciting a symmetric, circularly rotating mode in waveguide 210, an asymmetric, ellipsoidally or linearly rotating mode may be excited. This asymmetry in the microwave configuration can lead, in turn, to process aberrations in an adjacent process chamber (e.g., process chamber 130, FIGS. 1, 2A, where a plasma is powered by the microwaves in waveguide 210). For example, an asymmetric microwave configuration can lead to a correspondingly asymmetric plasma and consequently to local skews in depth of plasma etching.

One approach to addressing the type of asymmetry noted above is to provide electrical correction to the phase delay between microwave signals 220(1) and 220(2), and thus between amplified microwave signals 235(1) and 235(2). For example, dual phase signal generator 215 may receive a correction signal 313 from a signal controller 312 that provides information for adjustment of signals 220(1), 220 (2). For example, correction signal 313 may direct dual phase signal generator 215 to provide a corrected or targeted phase offset between microwave signals 220(1), 220(2). Thus, in system 300 with a mechanical offset of $\pi/2$ between points P and Q, microwave signals 220(1), 220(2) may be out of phase with one another by $\pi/2$, or by $\pi/2$ plus or minus a target phase difference, such that a measured phase difference at points P and Q is as intended, as discussed below. In another example, correction signal 313 may direct dual phase signal generator 215 to boost and/or attenuate one or both of microwave signals 320(1), 320(2), which may advantageously help preserve a circular rotation of the microwave field.

Monitoring antennas 211(1) and 211(2) may be disposed at locations that are 180 degrees across waveguide 210 from points P and Q respectively, and provide analog signals to signal controller 312 through their respective connections 318(1) and 318(2). These measurements, within waveguide 210 itself, will capture any phase and/or amplitude offset introduced by tuners 250. Monitoring antennas 211 may monitor either an electrical field or a magnetic field component of microwaves in waveguide 210. The locations of monitoring antennas 211(1) and 211(2) 180 degrees across waveguide 210 from points P and Q (or at least each antenna 211 being at least 30 degrees away from either of P and Q) may enable the signals returned to signal controller 312 to include effects of waveguide 210 that are not readily monitored by monitoring antennas located at points P and Q. Signal controller 312 may receive signals from monitoring antennas 211(1) and 211(2) through their respective connections 318(1) and 318(2) and may determine amplitude of, and a phase offset between, signals at points P and Q. For example, signal controller 312 may perform in-phase and quadrature-phase demodulation (IQ demodulation) to measure amplitude and phase offset of the signals from monitoring antennas 211(1) and 211(2). Signal controller 312 may then utilize measured phase offset and/or amplitudes to calculate and provide a corresponding digital correction signal 313 to dual phase signal generator 215. Digital correction signal 313 may be chosen to be a desired phase offset (e.g., a value of $\pi/2$) or an offset from an assumed, desired phase difference (e.g., a correction factor that is zero when the desired phase difference is attained). Alternatively, digital correction signal may be chosen to adjust amplitude of one or both of microwave signals 320(1), 320(2). Dual phase signal generator 315 may then provide microwave signals 320(1) and 320(2) with a phase offset and/or amplitudes such that when the microwave signals propagate through the system, the phase offset between points P and Q is driven to the desired phase difference, and/or the amplitudes measured at points P and Q are as desired.

Optionally, a user input device 314 may provide one or more target parameters 316 to signal controller 312. User input device 314 may be implemented in a variety of ways, such as by physical switches providing an output that is received directly by signal controller 312, or as a part of system management hardware and software that acquires the target parameters from a user interface (e.g., a keyboard, other buttons, or a graphical user interface (GUI)). Target parameters 316 may include, for example, a desired phase difference as measured at monitoring antennas 211(1) and 211(2), or amplitude adjustments to either or both of microwaves driven into waveguide 210. Target parameters 316 can be utilized by signal controller 312 along with the analog signals from monitoring antennas 211(1) and 211(2), to generate digital correction signal 313. For example, when a target phase difference is utilized, digital correction signal 313 may be generated first based on the signals from monitoring antennas 211(1) and 312(1), after which digital correction signal 313 may be adjusted by adding or subtracting target parameter 316. Once digital correction signal 313 is transmitted, dual phase signal generator 315 may provide signals 320(1) and 320(2) with a corresponding offset until the phase offset between points P and Q is driven according to the target parameter, and digital correction signal 313 is driven to its target value, or zero. In another example, when a target amplitude adjustment is utilized, dual phase signal generator 215 can adjust amplitude of either or both of signals 320(1), 320(2) in response thereto.

Optional user input device 314 may thus provide a useful, independent degree of freedom for optimizing a semiconductor processing system that includes system 300 or other systems with a similar capability, as disclosed herein. For example, a corresponding semiconductor processing system may be optimized by processing (e.g., etching) wafers. Each wafer could be processed with identical processing parameters except for a different target parameter entered into user input device 314. The performance of the system could be evaluated by measurements of the wafers that are indicative of performance of the etch system (e.g., etch rate, selectivity, linewidth change due to etch, and the like) as well as system monitors (e.g., system stabilization times, endpoint detection parameters, etc.) An optimized value of the target parameter could then be selected, based on the wafer measurements, the system monitors and/or a combination thereof.

It will be understood by one skilled in the art that while signal controller 312 cooperates with dual phase signal generator 215 to adjust phase of microwave signals 320(1) and 320(2), tuners 250 also continue to adjust impedance matching to minimize reflected power. Thus, system 300 does not sacrifice impedance matching, but rather provides the additional capability of phase and/or amplitude adjustment for electronics sets 255(1) and 255(2), to optimize plasma symmetry in a process chamber adjacent to waveguide 210. That is, in embodiments, signal generator 315 adjusts the phase offset, and tuners 250 provide the impedance matching, concurrently with one another during the operation of system 300. In other embodiments, signal generator 315 adjusts the amplitude, and tuners 250 provide the impedance matching, concurrently with one another during the operation of system 300.

Embodiments herein recognize that as wafer sizes grow larger and the geometries produced in semiconductor fabrication grow smaller, the need for uniformity control of all aspects of the processing environment around the wafer increases. Therefore, embodiments herein adjust the microwave configuration that generates the plasma, not only to match impedance, but also to adjust phase and/or amplitude after impedance is matched, for improved symmetry of the plasma generated around the wafer. Even when careful attention is paid to symmetry of a process chamber, placement of a wafer in the process chamber, and the like, asymmetries in a plasma can arise from many causes (e.g., mechanically asymmetric ports for gas or plasma input and outlets, sensors, wafer placement, wafer flats, cabling length, material variations in any of the above components, and the like). To correct for these causes, additional degrees of control, in addition to impedance matching, may provide extra and useful tools for improving uniformity in plasma processing. While system 300 provides some control through electronic adjustments of amplitude and phase, further mechanical and electrical adjustments described below are also useful.

Figure 4:
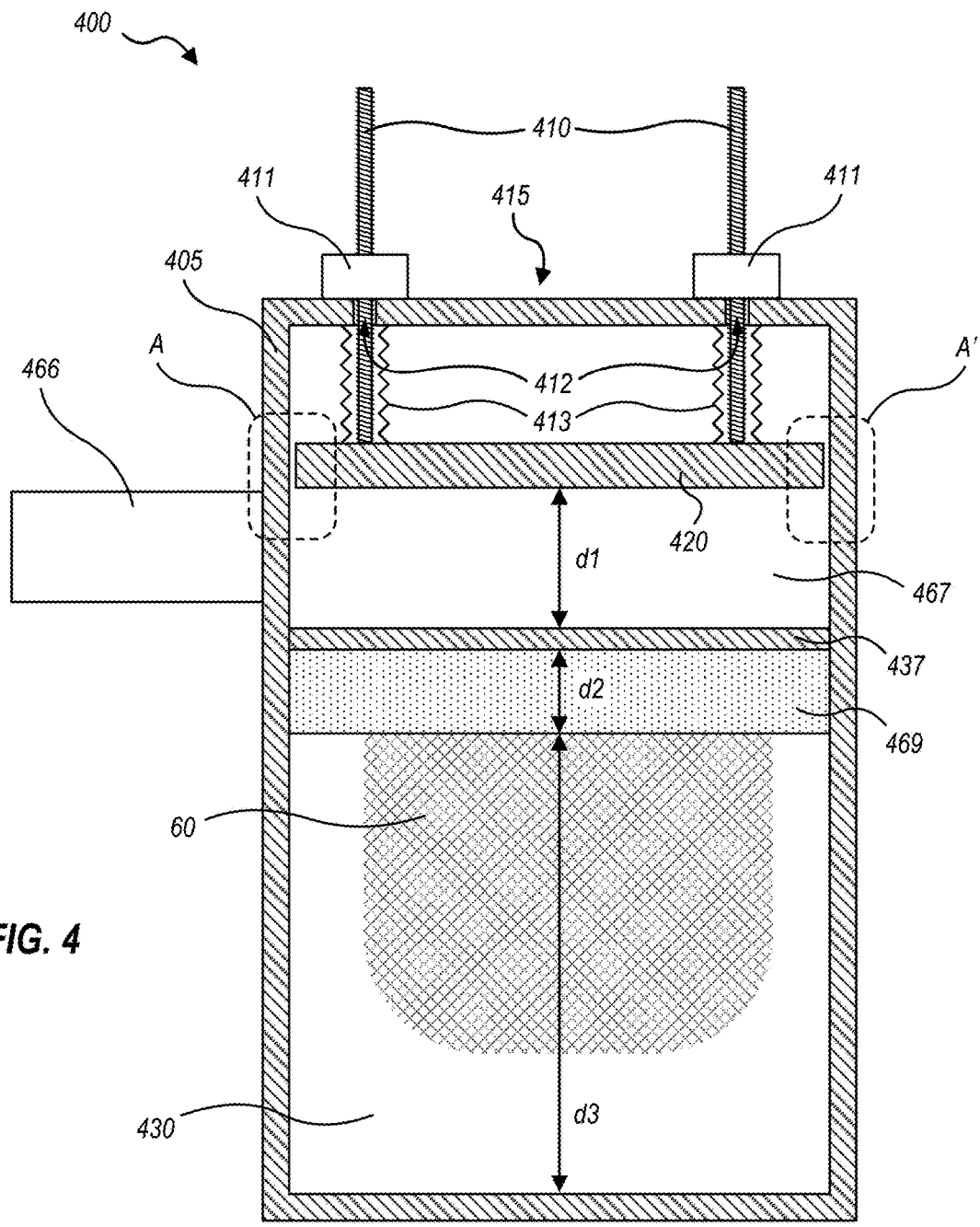
FIG. 4 is a schematic cross-sectional drawing illustrating a portion of a plasma processing system that adjusts position of a movable plate within a waveguide cavity, according to an embodiment.

FIG. 4 is a schematic cross-sectional drawing illustrating a portion of a plasma processing system 400 that adjusts a height d1 of a movable conductive plate 420 within a waveguide cavity 467. In system 400, a conductive plate 437 that is coupled with housing 405 forms a lower bound of a waveguide cavity 467. A dielectric plate 469 is adjacent to, and in direct contact with, conductive plate 437. Similar to the discussion above in connection with FIG. 2A, d1 and d2 affect the ability of waveguide cavity 467 and dielectric plate 469, respectively, to support eigenmodes. While frequency adjustment can be used to adjust one or the other of these arrangements to support an eigenmode, the frequency adjustment may not create eigenmode conditions simultaneously in both waveguide 467 and dielectric plate 469. That is, an additional degree of freedom in adjustments may be useful.

System 400 includes one or more adjustment devices 410 that couple with housing 405 and movable conductive plate 420. Movable conductive plate 420 faces process chamber 430 across microwave cavity 467, that is, plate 420 is on a distal side of waveguide cavity 467 from the process chamber 430. Adjustment devices 410 are shown as threaded rods in FIG. 4, but as discussed below, many other types of adjustment devices may be used. In the embodiment illustrated in FIG. 4, devices 410 extend through openings 412 in a ceiling plate 415 of a housing 405. A height of each device 410, and a corresponding height of movable conductive plate 420 within housing 405, can be adjusted with a corresponding nut 411. This additional degree of freedom allows, for example, a microwave frequency to be tuned first, to support the eigenmode condition within plate 469; then, d1 can be tuned so that movable conductive plate 420 is at an eigenmode position within waveguide 467. By tuning each of these structures to support their respective eigenmodes, efficient coupling and high field strength at a lower surface of dielectric plate 469 (e.g., for igniting a plasma) is provided. d3 represents a height of dielectric plate 469 over a floor surface of process chamber 430, and will be constrained at least somewhat by the need to provide clearance for a workpiece holder and a workpiece itself (e.g., pedestal 135 and workpiece 50, FIG. 2A).

Like conductive plate 137 discussed above, conductive plates 437 and 420 may be formed of metal, for example, but can also be formed of other conductive materials, or conductive materials that are partially or completely coated with protective (e.g., not necessarily conductive) materials.

Although adjustment devices of rods and nuts are shown to illustrate the concept of adjustment devices 410, it will be clear to one skilled in the art that any type of mechanical or electromagnetic actuator may be substituted for the rod and nut combination shown. For example, geared devices, spring loaded devices, magnetic actuators, stepper motors, piezoelectric actuators or other electromagnetic devices could be substituted. One of ordinary skill in the art, upon reading and comprehending the present disclosure, will readily recognize alternatives, equivalents, modifications, and intermediate combinations that can be used as adjustment devices or actuators. In some embodiments, a plurality of hollowed regions is formed on a lower surface of dielectric plate 469 to promote plasma ignition, as discussed in connection with dielectric plate 169, FIG. 1.

Certain embodiments utilize a single device 410 to adjust d1 across waveguide cavity 467, while other embodiments use three devices 410 to adjust a plane formed by movable conductive plate 420 with respect to plate 437. Connections of devices 410 to movable conductive plate 420 may include flexible materials or joints that allow movable conductive plate 420 to tilt with respect to devices 410. Still other embodiments may use more devices 410 with a deformable conductive plate 420, to provide point to point control over d1 and microwaves in waveguide cavity 467 without regard to planarity of movable conductive plate 420 or underlying plate 437. Optionally, each device 410 is surrounded above movable conductive plate 420 by a conductive bellows 413 that couples mechanically and electrically with ceiling plate 415. Bellows 413 thus ensures that movable conductive plate 420 is at the same electrical potential as housing 405, and can contain any particles that may be shed where devices 410 pass through ceiling plate 415 and engage nuts 411.

In system 400, a small gap may be needed between movable conductive plate 420 and sides of housing 405, to ensure that conductive plate 420 can move freely. This can adversely affect the propagation of microwaves within waveguide cavity 467 by allowing propagation of some microwaves through the gap, which can disturb the eigenmode condition. A region denoted as A in FIG. 4 is illustrated in FIGS. 5A through 5D, with options for managing this effect. The RF gasket illustrated in FIG. 5A, or one of the RF chokes illustrated in FIG. 5B, may be installed about movable conductive plate 420, and will thus be present in region A' as well as region A (e.g., A and A' are 180 degrees about a circumference of housing 405 from one another).

Figure 5A:
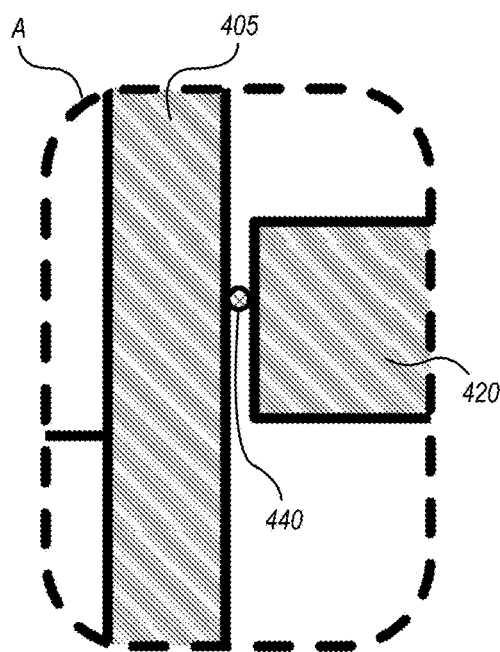
FIG. 5A is a schematic diagram of a region of FIG. 4, illustrating an RF gasket for reducing microwave leakage between a movable plate and a housing, according to an embodiment.

FIG. 5A illustrates an RF gasket 440 inserted between movable conductive plate 420 and housing 405. RF gasket 440 will generally reduce microwave leakage effectively, but may scrape against either or both of movable conductive plate 420 and housing 405. This may generate metal particles, which may undesirably affect and move around waveguide cavity 467 in response to microwaves.

Figure 5B:
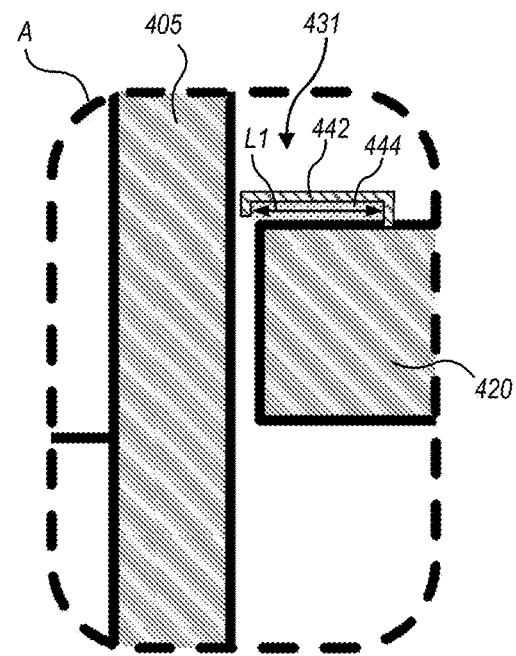
FIG. 5B is a schematic diagram of a region of FIG. 4, illustrating a first RF choke for reducing microwave leakage between a movable plate and a housing, according to an embodiment.

FIG. 5B illustrates an RF choke 431 including a conductive holder 442 that is coupled with movable conductive plate 420, and a dielectric material 444 held by holder 442 against a top surface of movable conductive plate 420. Advantageously, dielectric material 444 has a lateral dimension $$L1 = \frac{m\lambda}{2\sqrt{\varepsilon_1}},$$

where $\varepsilon_1$ is a dielectric constant of material 444, $\lambda$ is the wavelength of the microwaves and m is any integer greater than zero.

Figure 5C:
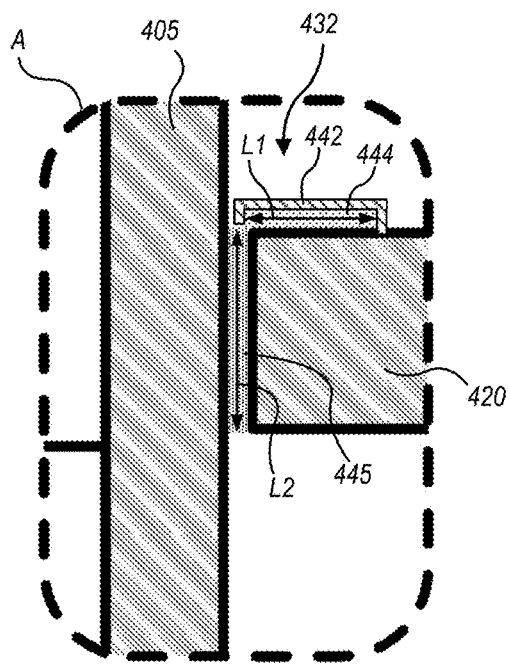
FIG. 5C is a schematic diagram of a region of FIG. 4, illustrating a second RF choke for reducing microwave leakage between a movable plate and a housing, according to an embodiment.

FIG. 5C illustrates an RF choke 432 including the features of RF choke 431, and adds a second dielectric material 445. Advantageously, dielectric material 444 has a dimension $$L2 = \frac{p\lambda}{2\sqrt{\varepsilon_2}},$$

where $\varepsilon_2$ is the dielectric constant of material 445, $\lambda$ is the wavelength of the microwaves and p is any integer greater than zero. Consideration should be given to the fact that the dielectric will rub against housing 405; soft and/or non-shedding dielectrics such as polytetrafluoroethylene (e.g., Teflon®) or polyetheretherketone (PEEK) may be useful as material 445.

Figure 5D:
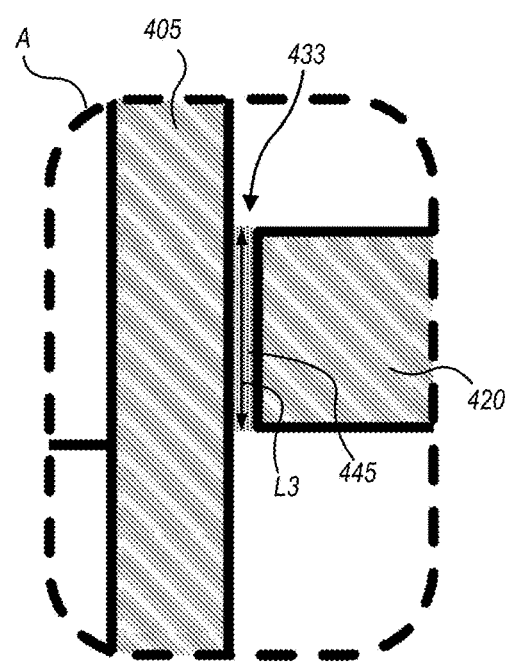
FIG. 5D is a schematic diagram of a region of FIG. 4, illustrating a third RF choke for reducing microwave leakage between a movable plate and a housing, according to an embodiment.

FIG. 5D illustrates an RF choke 433 including only second dielectric material 445. In this embodiment, dielectric material 445 advantageously has a dimension $$L3 = \frac{n\lambda}{4\sqrt{\varepsilon_2}},$$

where $\varepsilon_2$ is the dielectric constant of material 445, $\lambda$ is the wavelength of the microwaves and n is any odd integer greater than zero. L3 is chosen so as to prevent the excitation of electromagnetic waves in the dielectric filled gap, thus reducing microwave leakage through the gap.

Certain embodiments herein can address situations such as when the signal generator, amplifying electronics and/or other components (e.g., electronics sets 225, FIG. 3) cannot provide a broad enough tuning range, or a large variety of resonant modes are desired. One approach to this is to remove the conductive plate bounding the waveguide cavity (e.g., cavities 167 or 467) such that the housing (e.g., housing 405) defines a single cavity.

Figure 6:
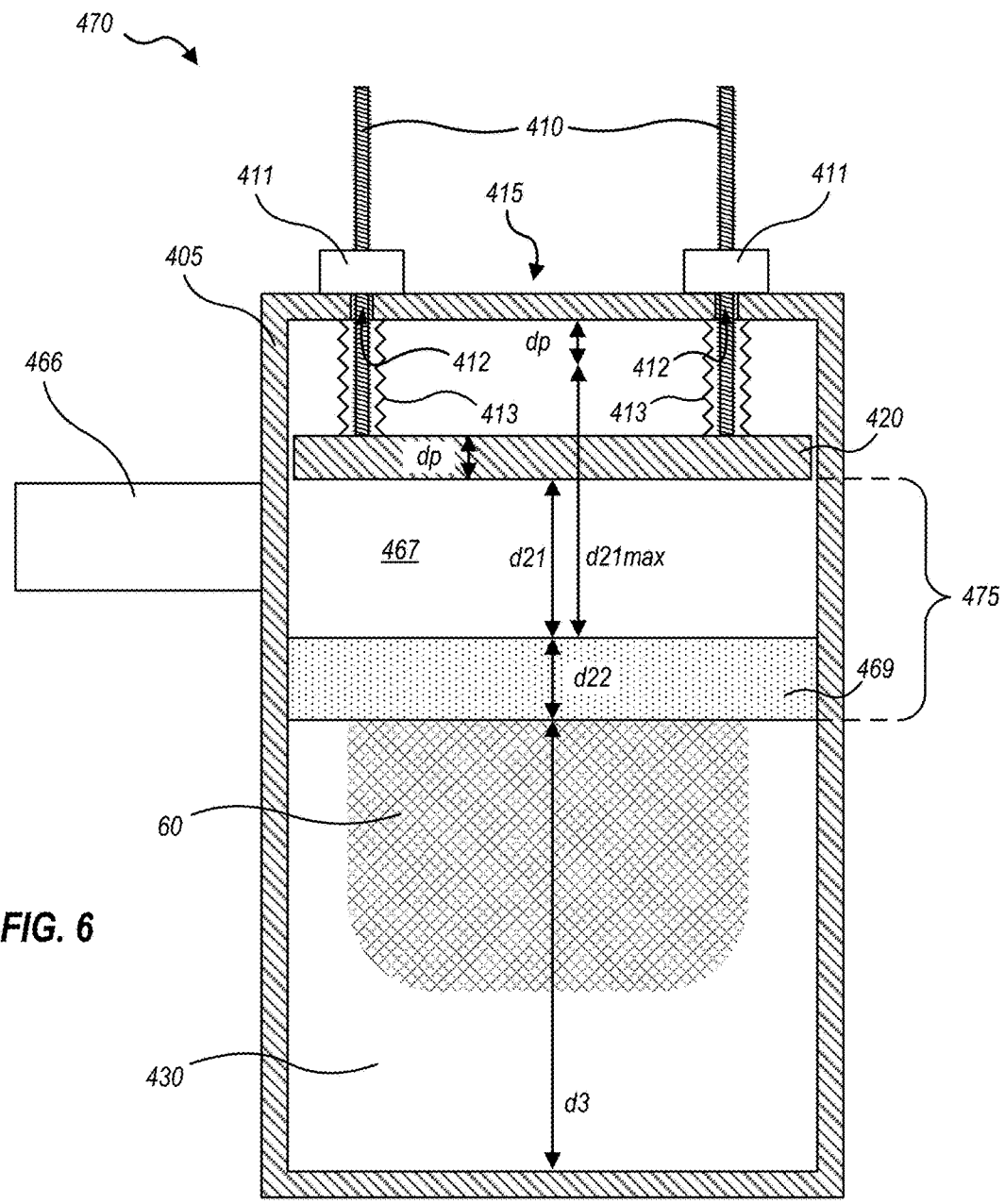
FIG. 6 is a schematic cross-sectional drawing illustrating a portion of a plasma processing system that includes most of the features of the plasma processing system of FIG. 4, according to an embodiment.

FIG. 6 is a schematic cross-sectional drawing illustrating a portion of a plasma processing system 470 including most of the features of plasma processing system 400, FIG. 4. However, system 470 does not include a conductive plate at the bottom of cavity 467. Because the components that are used in system 470 are the same as those in system 400, the same reference numerals are used for such components, but because the electrical behavior is different, some of the dimensions are noted differently. d21 now represents an air gap height of cavity 467, while d22 represents a thickness of dielectric plate 469.

Electrically, system 470 is a single cavity bounded by housing 405 and movable conductive plate 420 having a thickness dp. However, thickness and dielectric constant of dielectric plate 469, as well as dimension d21 shown, will still have effects on how microwaves propagate within the cavity, including effects on eigenmode conditions. Thus, a mechanism for adjusting height of movable conductive plate 420, here shown again as adjustment devices 410 and nuts 411, remains a useful tool for tuning microwave conditions within cavity 467. Of course, it is clear to one skilled in the art that any type of mechanical or electromagnetic actuator may be substituted for the rod and nut combination shown; all of the discussion about these features in connection with system 400 is equally applicable to system 470. With such height adjustment device in place, d21 can be thought of as a variable with a minimum value of zero to a maximum value of d21 max, where movable conductive plate 420 will abut ceiling plate 415 (a lower surface of movable conductive plate 420 will be the thickness of the movable plate, dp, below ceiling plate 415). In practice the limits of zero and d21 max may be further limited by travel limits of the movable plate mechanism.

System 470 is advantageously adjustable to support at least one eigenmode within a portion of housing 405 designated as cavity 475. This allows fields to be efficiently coupled down to a lower surface of dielectric plate 469, where they will couple into plasma 60. When d21 is at its minimum value, the eigenmode will have a maximum frequency of $f_{max}$; when d21 is at its maximum value, the eigenmode will have a minimum frequency of $f_{min}$. Advantageously, electronics sets driving microwave inputs 466 support all frequencies from $f_{min}$ to $f_{max}$ so that an eigenmode can be supported for any physical setting of movable conductive plate 420. There will typically be one eigenmode position available for movable conductive plate 420, for any frequency available from the electronics sets, although if d21 max is sufficiently large, there may be more than one eigenmode position available.

Figure 7:
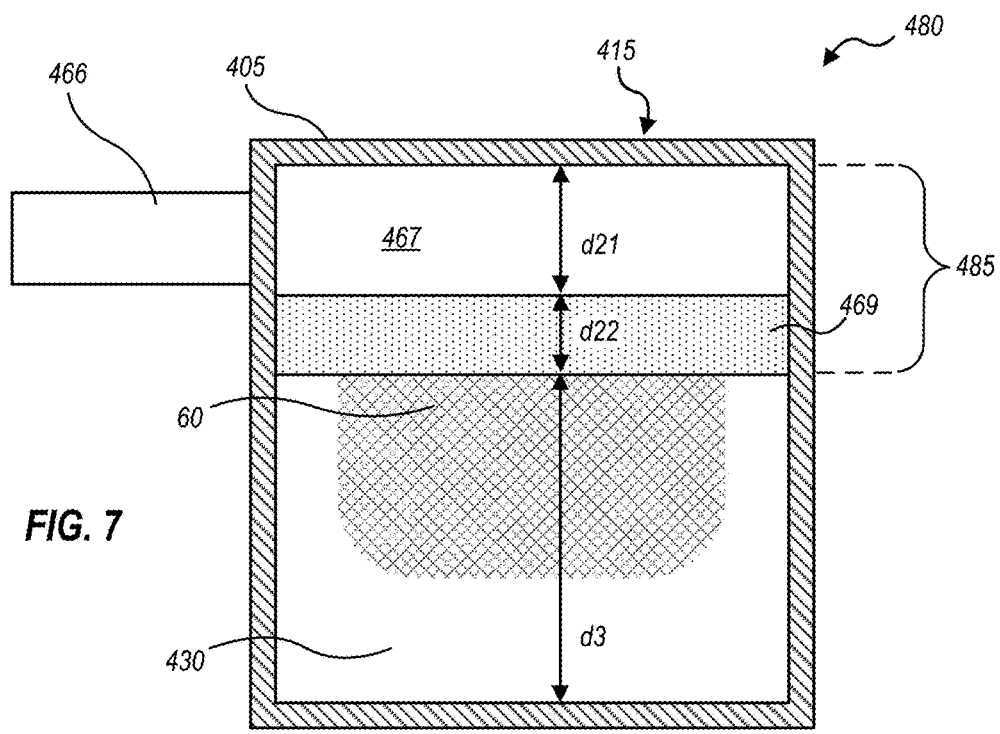
FIG. 7 is a schematic cross-sectional drawing illustrating a portion of a plasma processing system that includes most of the features of the plasma processing system of FIG. 6, according to an embodiment.

FIG. 7 is a schematic cross-sectional drawing illustrating a portion of a plasma processing system 480 including most of the features of plasma processing system 470, FIG. 6. However, system 480 does not include a movable ceiling plate. When characteristics of housing 405, components therein, and dimensions d21 and d22 are well known and/or controlled, it becomes possible to provide a unitary housing with vacuum sealed dielectric plate 469 therein, with the dimensions tuned such that an eigenmode is supported by cavity 485, analogous to cavity 475 of system 470, FIG. 6. Furthermore, if electronics sets driving microwave inputs 466 support frequency adjustment, it may be possible to tune frequency of the microwaves to support an eigenmode within cavity 485, notwithstanding the fact that d21 and d22 are fixed. Alternatively, if d21 can be adjusted before housing 405 is sealed (e.g., by characterizing system 480 under power, with a temporary mechanism for adjusting height of dielectric plate 469, that can later be withdrawn) then a finished system 480 can be provided in a more compact form with fewer active parts or adjustments. Similarly to system 400, FIG. 4, considerations of size, weight, cost, materials to be used, and the like can be used to select dimensions d21 and d22. d22, in particular, needs to be thick enough to withstand the force of atmospheric pressure across dielectric plate 469 when process chamber 430 is evacuated, but when d22 is very high, dielectric plate 469 may become heavy and costly.

Figure 8:
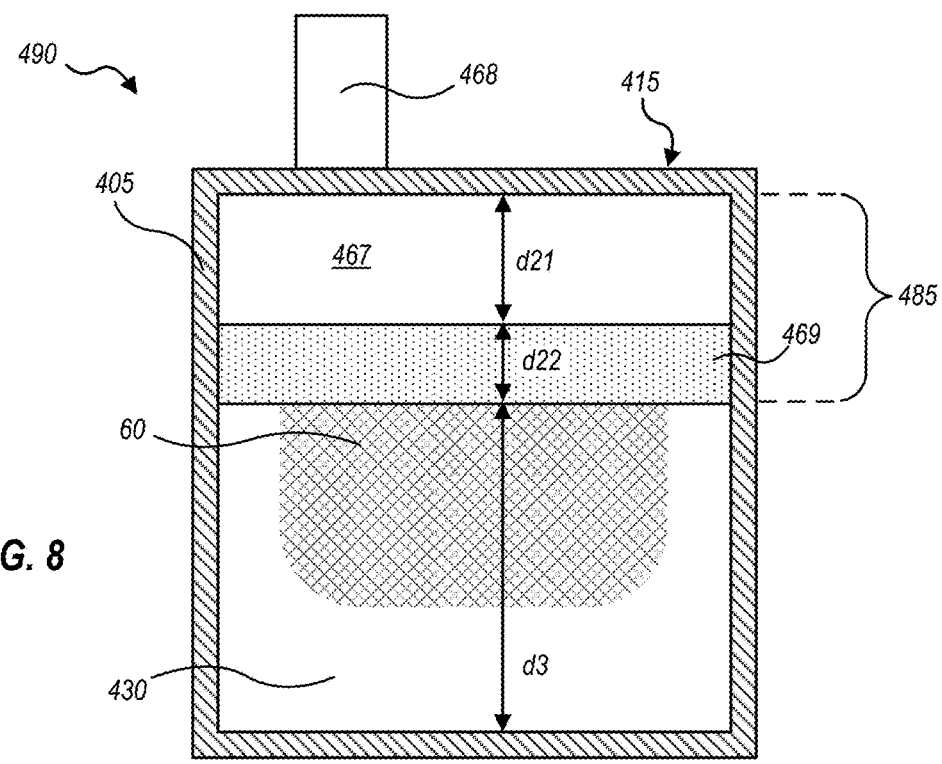
FIG. 8 is a schematic cross-sectional drawing illustrating a portion of a plasma processing system that includes most of the features of the plasma processing system of FIG. 7, according to an embodiment.

FIG. 8 is a schematic cross-sectional drawing illustrating a portion of a plasma processing system 490 including most of the features of plasma processing system 480, FIG. 7. However, system 490 is powered from a top-injecting microwave input 468, instead of side-injecting microwave input 466 shown in systems 400, 470 and 480, FIGS. 4, 6 and 7. Although other embodiments could theoretically use top-injecting microwave inputs like input 468, integrating such inputs with the movable plates of such embodiments may be difficult. Like system 480, system 490 can be provided in a compact form, especially in applications where integrating one or more side-injecting microwave inputs 466 is problematic.

Figure 9:
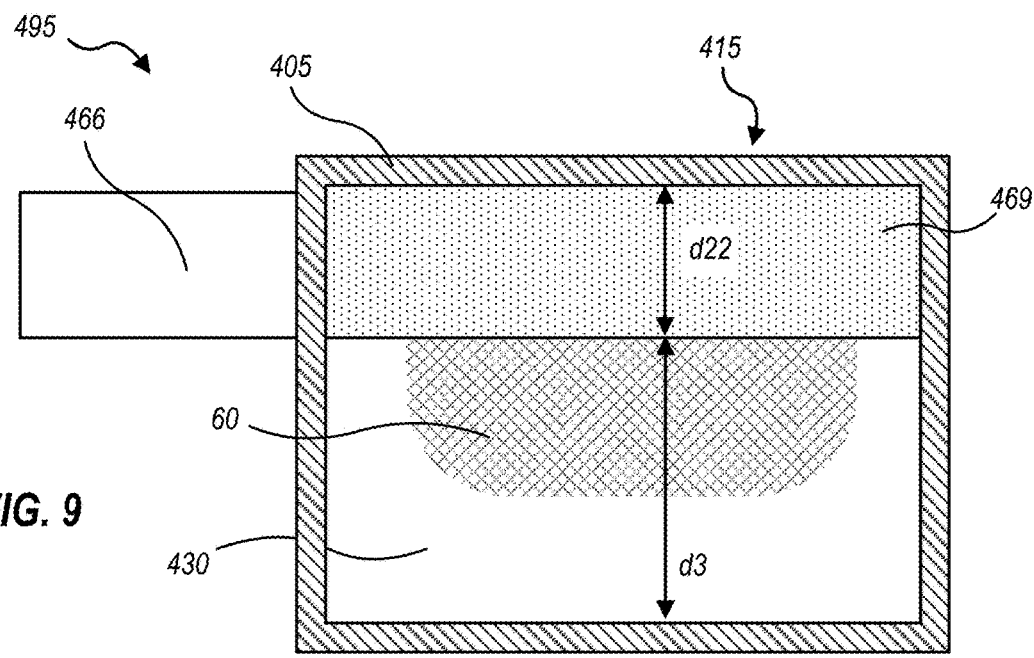
FIG. 9 is a schematic cross-sectional drawing illustrating a portion of a plasma processing system that includes similar features as the plasma processing system of FIG. 7, according to an embodiment.

The design of FIGS. 7 and 8 can be further modified, in embodiments, by reducing d21 to zero. FIG. 9 is a schematic cross-sectional drawing illustrating a portion of a plasma processing system 495 that includes similar features as plasma processing system 480, FIG. 7, with d21 set to zero, that is, eliminating cavity 467. Like systems 480 and 490, system 495 can be provided in a compact form. In alternate embodiments of system 495, the side-injecting microwave input 466 can be replaced with top-injecting microwave input 468 of system 490, FIG. 8.

Figure 10:
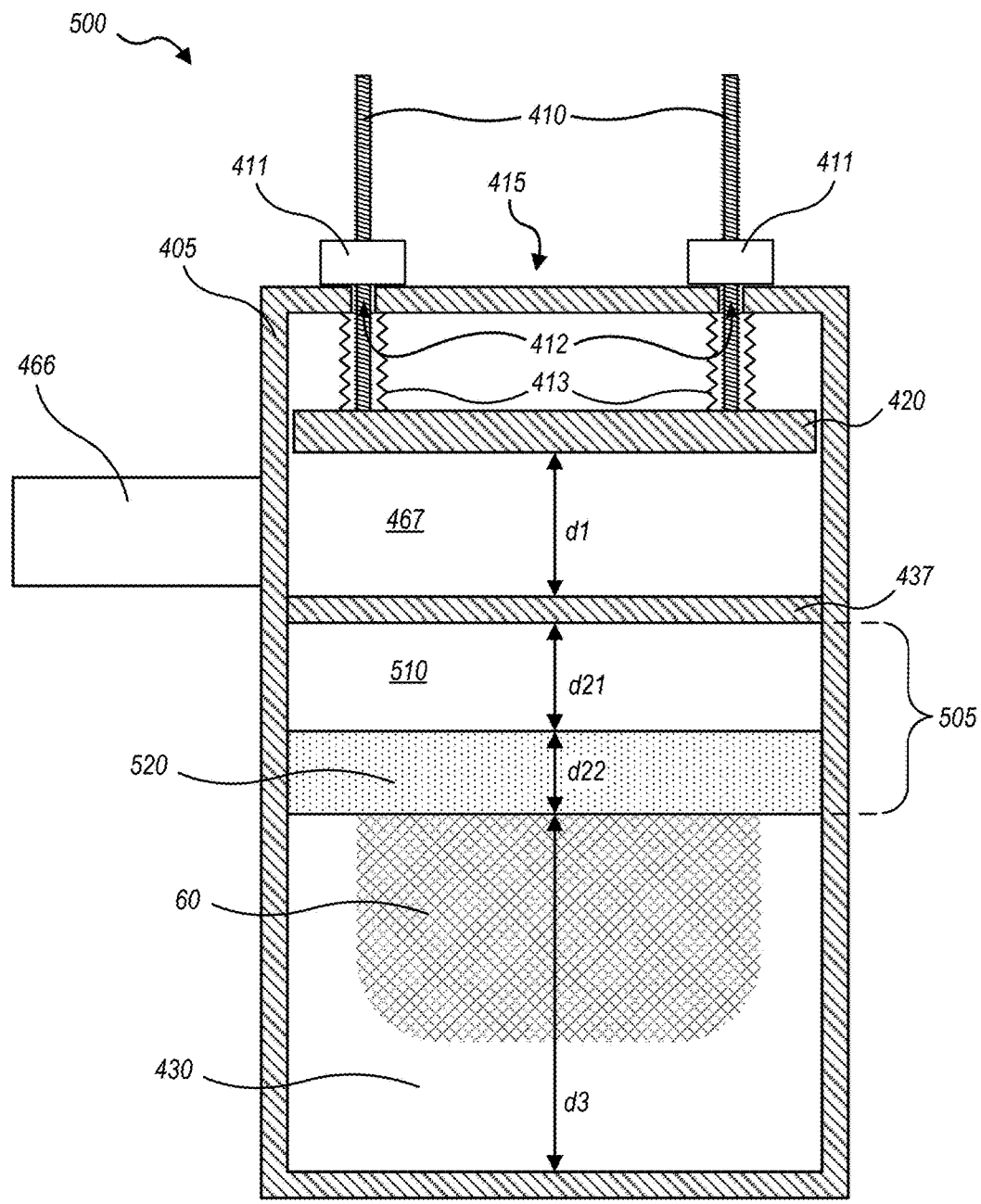
FIG. 10 is a schematic cross-sectional drawing illustrating a portion of a plasma processing system that includes most of the features and operational concepts of the plasma processing systems of FIG. 4 and FIG. 7, according to an embodiment.

FIG. 10 is a schematic cross-sectional drawing illustrating a portion of a plasma processing system 500 including most of the features and operational concepts of plasma processing system 400, FIG. 4, and processing system 480, FIG. 7. System 500 introduces a gap 510 between plate 437 and a dielectric plate 520 that, similar to dielectric plate 469, seals off process chamber 430 from gap 510 and cavity 467 such that those regions are not evacuated when process chamber 430 is evacuated. A cavity 505 can be defined to include gap 510 and dielectric plate 520. Then, in similar manner to processing system 480, FIG. 7, if electronics sets driving microwave inputs 466 support frequency adjustment, it may be possible to tune frequency of the microwaves to support an eigenmode within cavity 505, notwithstanding the fact that d21 and d22 are fixed. That is, the frequency adjustment can be used to tune cavity 505 to support another one eigenmode, while movable conductive plate 420 can be used to tune cavity 467 to support another, possibly similar eigenmode (e.g., if $TE_{112}$ is excited within cavity 505, $TE_{111}$ may advantageously be excited within cavity 467).

Figure 11:
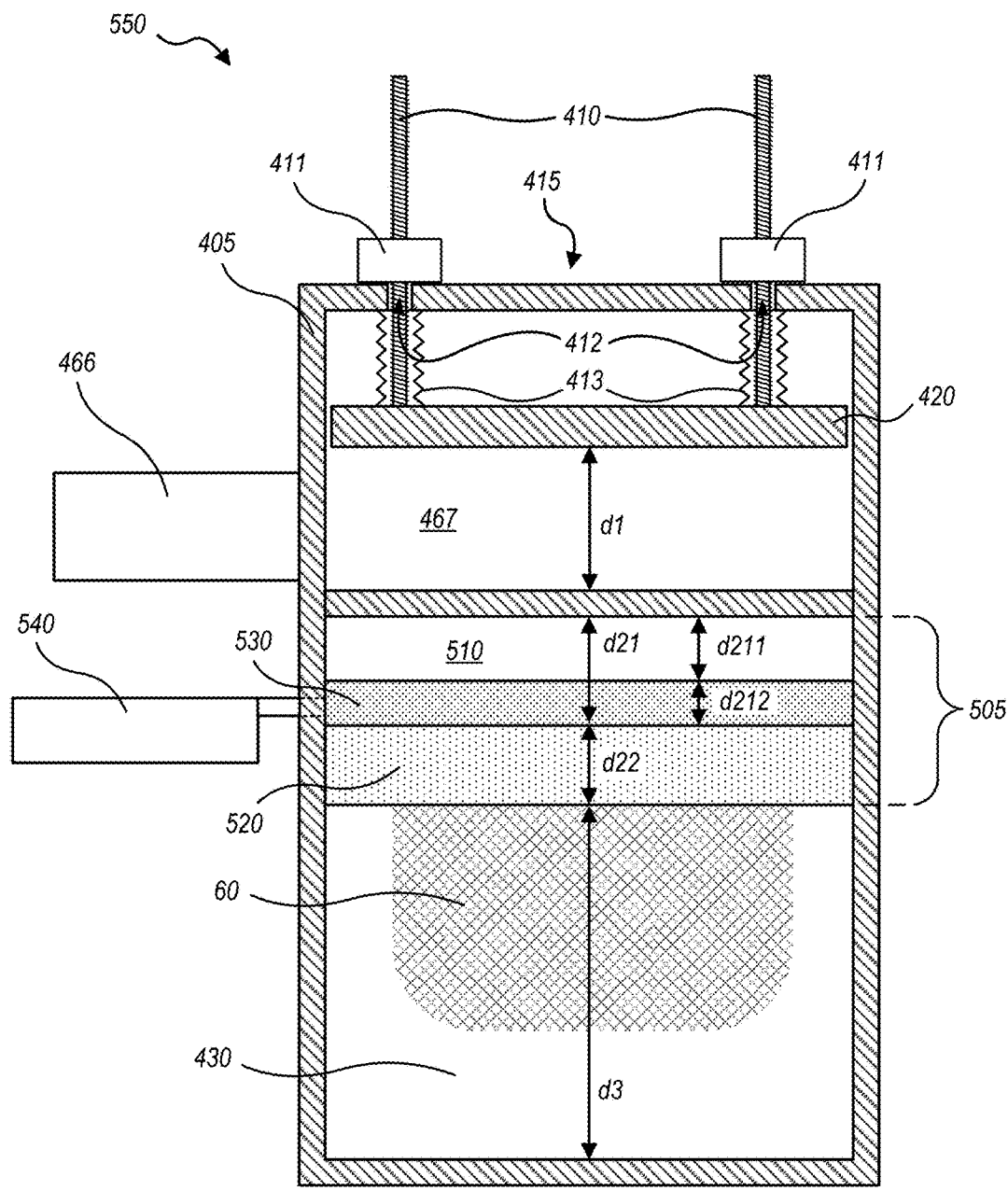
FIG. 11 is a schematic cross-sectional drawing illustrating a portion of a plasma processing system that includes most of the features and operational concepts of the plasma processing system of FIG. 10, according to an embodiment.

FIG. 11 is a schematic cross-sectional drawing illustrating a portion of a plasma processing system 550 including most of the features and operational concepts of plasma processing system 500, FIG. 10. System 550 introduces an adjustable dielectric layer 530 of controllable height, which may be, for example, a layer of a liquid dielectric (or a bladder filled with the liquid dielectric) that does not absorb significant energy at microwave frequencies. A suitable material for adjustable dielectric layer 530 is perfluoropolyether (PFPE), which has a dielectric constant of $\epsilon=1.94$ and a loss tangent of $\tan \delta = 2 \times 10^{-4}$. A cavity 505 can be defined as including gap 510, adjustable dielectric layer 530 and dielectric plate 520. Height d21 within cavity 505 can be defined as an electrical length sum of a height d211 of gap 510 and a height d212 of adjustable dielectric layer 530, i.e. $d21 = d211 + \sqrt{\epsilon_{liquid}}\, d212$, where $\epsilon_{liquid}$ is the dielectric constant of dielectric layer 530. A controller 540 can add or remove portions of the liquid dielectric through a fluid connection, and thus mechanically regulate adjustable dielectric layer 530 to create or maintain an eigenmode condition within cavity 505. This provides an extra degree of freedom for optimizing operation of system 550, in that movable conductive plate 420 can be used to optimize cavity 467 and adjustable dielectric layer 530 can be used to optimize cavity 505, without needing to tune a frequency of microwaves supplied through microwave input 466. Thus, if electronics sets powering microwave input 466 are tunable, the tunability can be reserved for optimizing other features (e.g., creating or maintaining an eigenmode condition within process chamber 430). Alternatively, non-tunable electronics sets can be used, to reduce cost.

Figure 12:
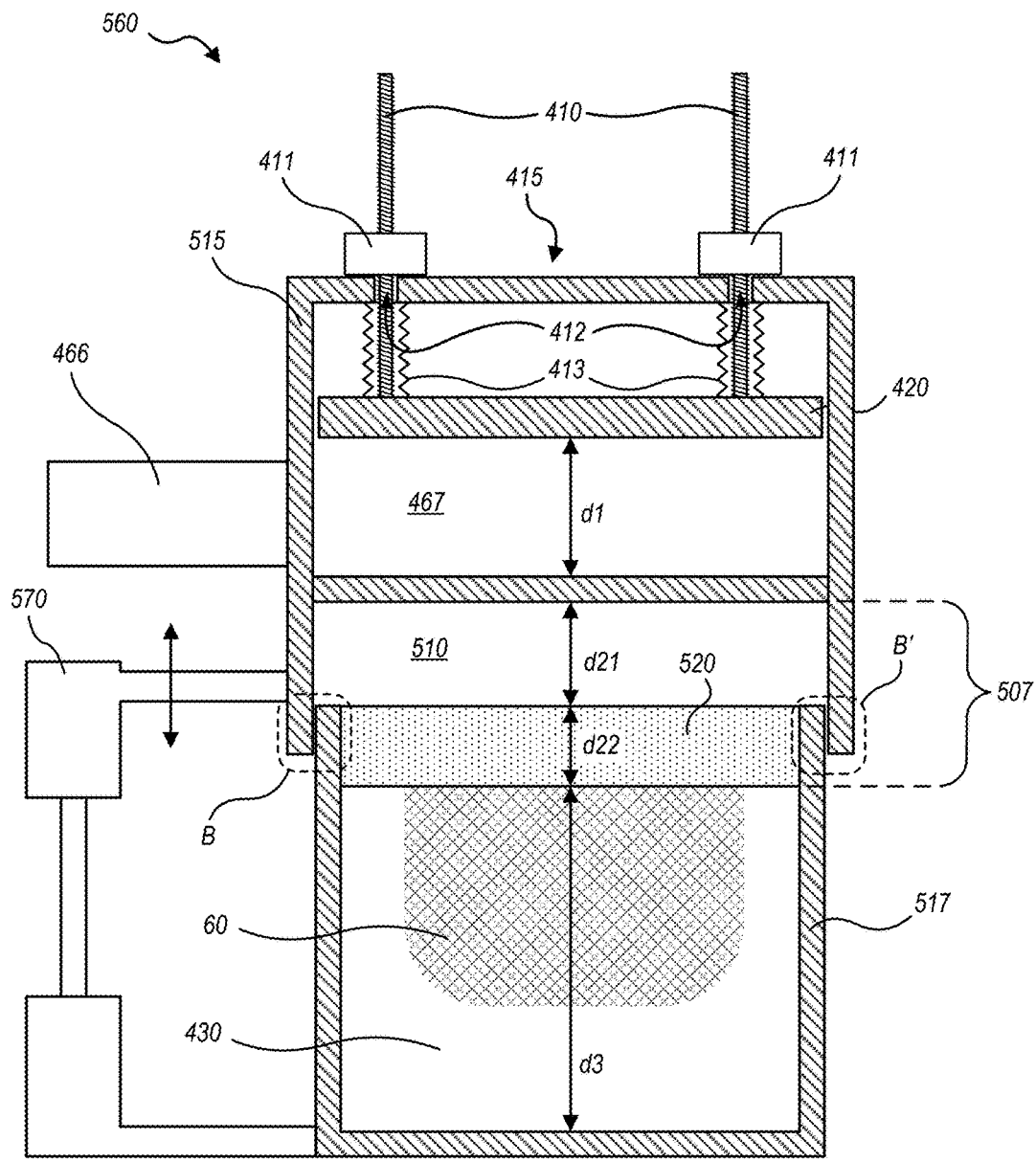
FIG. 12 is a schematic cross-sectional drawing illustrating a portion of another plasma processing system that includes most of the features and operational concepts of the plasma processing system of FIG. 10, according to an embodiment.

FIG. 12 is a schematic cross-sectional drawing illustrating a portion of a plasma processing system 560 including most of the features and operational concepts of plasma processing system 500, FIG. 10. System 560 introduces an upper housing 515 that includes microwave cavity 467, and a lower housing 517 that includes process chamber 430. Relative positions of upper housing 515 and lower housing 517 are adjusted through an actuator 570 that, like adjustment devices 410, may be mechanical, magnetic, electromagnetic, piezoelectric or the like. Adjusting the relative positions of upper housing 515 and lower housing 517 causes a height of gap 510 to increase or decrease, respectively. A cavity 507 can be defined as including gap 510 and dielectric plate 520, thus, extension or contraction of actuator 570 can be used to tune cavity 507 in a similar manner as adjustable dielectric layer 530 tunes cavity 505 of system 550 (FIG. 11). The RF gasket illustrated in FIG. 5A, or one of the RF chokes illustrated in FIG. 5B, may be installed at the interface between upper housing 515 and lower housing 517, and will thus be present in region B' as well as region B (e.g., B and B' are 180 degrees about a circumference of housings 515, 517 from one another).

Methods now discussed provide a means of mitigating local effects of nonuniformities during processing. Dimensional variations, material nonuniformities, apparatus asymmetries and the like can cause certain regions of a process chamber to have more intense plasma action than other areas. These effects may be localized or generalized within a system; that is, some process nonuniformities may affect individual locations that are difficult to predict in advance, while other nonuniformities may be predictably radial or azimuthal relative to the cylindrical form of waveguide 210. When these effects occur, corresponding areas of a workpiece 50 processed by the plasma may be processed nonuniformly.

Figure 13:
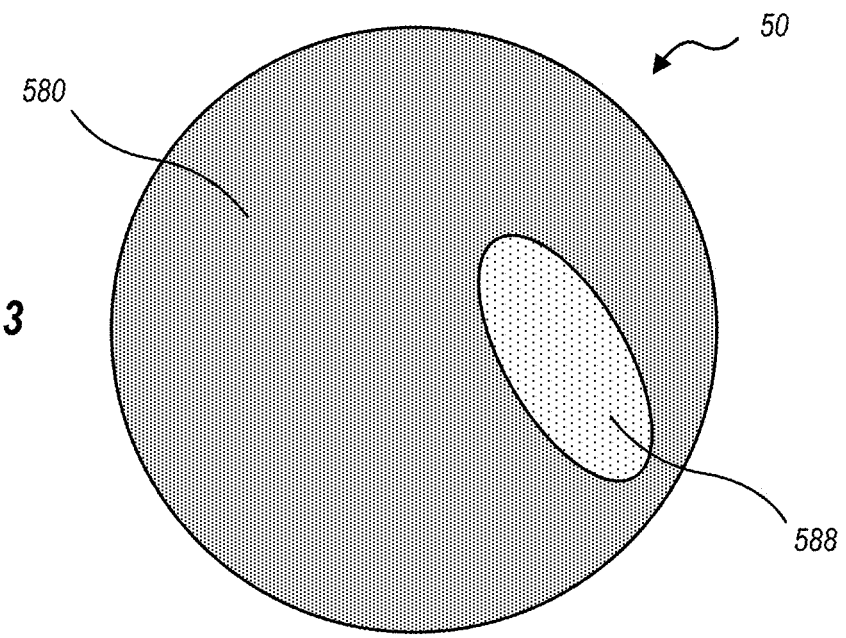
FIG. 13 illustrates an exemplary pattern of process variation on a workpiece.

FIG. 13 illustrates an exemplary pattern of process variation on a workpiece 50 (e.g., a semiconductor wafer). A region 580 is processed with nominal results, while a region 588 is processed with a degraded result due to one or more small variations in parameters such as gas distribution uniformity, electric field uniformity, variation in process chamber materials, and/or existence of asymmetrical items such as sensors, access ports, workpiece handling equipment and the like associated with the process chamber. A significant difference in appearance between regions 580 and 588 is for purposes of illustration only. That is, region 588 may receive processing (e.g., etching or deposition) that may only be a few percent different from that received in region 580, but it would still be desirable to reduce that percentage as much as possible.

Figure 14:
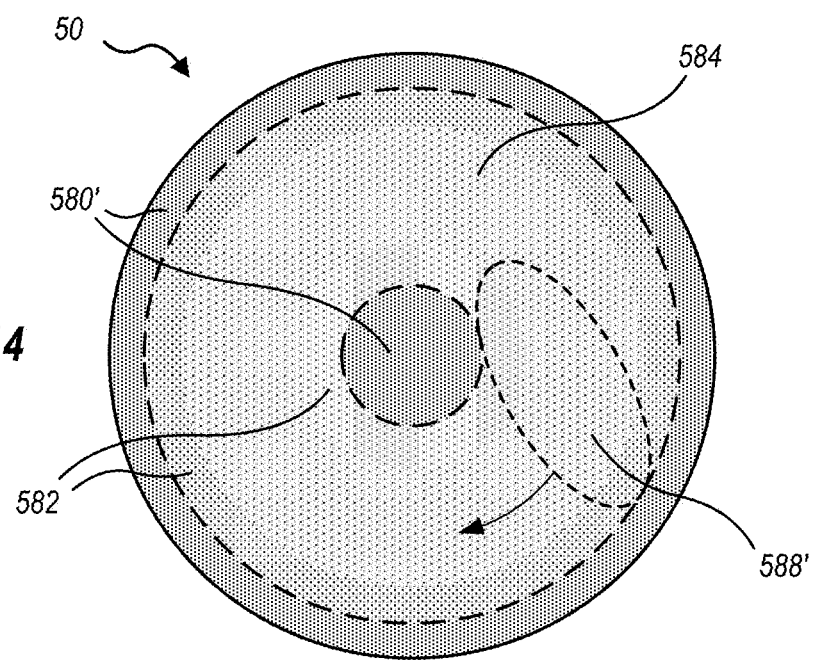
FIG. 14 illustrates the effect of a rotating wave process on the processing of a workpiece, according to an embodiment.

In embodiments, the effects of region 588 may be made to rotate about workpiece 50 through purely electrical means, while workpiece 50 itself remains stationary. FIG. 14 illustrates the effect of a slow rotating wave process on the processing of workpiece 50. The terms "slow rotating" or "slowly rotating" are used herein to mean wave patterns that change over time at a rate or frequency much lower (e.g., not more than $\frac{1}{1000}^{th}$) than the propagation frequency of electromagnetic radiation. For example, nominal microwave frequencies herein may be about 2.5 GHz, but slow rotating modes will have frequencies <1 MHz, and often <10 KHz.

A ghost outline of region 588, designated as 588', can be made to rotate over workpiece 50 in an anticlockwise direction, as shown (and could similarly rotate in a clockwise direction). Rotating region 588' may be seen as smoothing or smearing out the effects originally present in region 588, so that no part of workpiece 50 is affected to the same extent as the original region 588. In the example shown, region 588' does not happen to rotate over inner and outer regions of workpiece 50, so these regions remain designated as regions 580'. A small portion of region 588' rotates over bands 582 near the inner and outer regions of workpiece, while a large portion of region 588' rotates over a band 584 between bands 582. (It should be understood that workpiece 50 is depicted with bands for illustrative purposes only; the processing effects will fade into one another gradually, instead of making step function changes at edges of bands 582 and/or 584.) Accordingly, the process effects present in original region 588 can be spread over larger areas and will be reduced across bands 582 and 584, as compared to the concentration of such process effects in original region 588.

Choosing $\Omega$ such that many field rotations occur during the course of a plasma process allows a corresponding plasma nonuniformity to be rotated, thus smoothing out the effect of "hot" or "cold" processing spots (e.g., like region 588) that are caused by the nonuniformity, on a workpiece. $\Omega$ may also be adjusted empirically by the user, according to measured process uniformity results.

The effects of a rotating wave pattern within a waveguide cavity on a plasma generated in an adjacent process chamber can also be different, depending on the speed of the rotation. When $\Omega$ is under about 100 Hz, plasma ignition can follow the field rotation closely. Consequently, not only the fields but also the plasma, rotate at the rotational frequency $\Omega$. When is over about 1000 Hz, the plasma cannot follow the field, yet is sensitive to the overall distribution of electrical field strength, producing a radially symmetric, uniform plasma distribution. At intermediate values between about 100 Hz and 1000 Hz, the effect is a blend of the rotating and radially symmetric plasma distributions. There can also be interactions between localized plasma effects due to random causes, and rotational frequency, such that sometimes adjusting rotational frequency $\Omega$ increases or decreases local processing nonuniformities. These interactions can be located by characterizing process performance over a variety of rotational frequencies $\Omega$, and choosing a value of $\Omega$ that provides the best uniformity. Advantageously, these effects can be implemented purely electronically, for example by having a user simply input a desired value of and having a controller of the process equipment (e.g., signal generator 215) calculate the appropriate microwave signals as per the following discussion. That is, no mechanical equipment modification is necessary.

Now consider the configurations of any of the above-mentioned systems 200, 300, 400, 470, 480, 495, 500, 550 and 560, in the context of the coordinate system shown with system 300, FIG. 3. In some of the embodiments discussed, slow wave rotation with a rotational angular frequency $$\Omega\left(\frac{\Omega}{2\pi} \sim 0.1 - 1000 \text{ Hz}\right)$$

for the generalized TE and TM mode (e.g., $TE_{mnl}/TM_{mnl}$) is provided as a means of mitigating local effects of nonuniformities during processing.

Assume microwaves are injected at a carrier frequency ω from microwave inputs P and Q in system 300, FIG. 3, with a time-variable amplitude proportional to $\cos(\Omega t)$, and $\cos(\Omega t + \varphi)$, respectively. Here φ denotes a temporal phase delay to be determined later, and t denotes time. The $TE_{mnl}/TM_{mnl}$ mode in the cylindrical cavity excited by the injection from microwave input P can be represented as:

$$A_p = a \cos \Omega t[\cos(\omega t - m\theta) + \cos(\omega t + m\theta)] \quad \text{Eq. (1)}$$

where terms depending on the radial (r) and axial (z) coordinates are included in coefficient a, and m is a positive integer.

Eq. (1) may also be written in the complex form:

$$A_p = \frac{a}{2} e^{j\Omega t} \{e^{j(\omega t - m\theta)} + e^{j(\omega t + m\theta)} + e^{-j(\omega t - m\theta)} + e^{-j(\omega t + m\theta)}\} \quad \text{Eq. (2)}$$

In the same manner, the $TE_{mnl}/TM_{mnl}$ mode excited by the injection from microwave input Q can be described in the complex form as:

$$A_q = \frac{a}{2} e^{j\Omega t} e^{j\varphi} \quad \text{Eq. (3)}$$
$$\{e^{j(\omega t - m(\theta - \theta_q))} + e^{j(\omega t + m(\theta - \theta_q))} + e^{-j(\omega t - m(\theta - \theta_q))} + e^{-j(\omega t + m(\theta - \theta_q))}\}$$

Rewriting Eqs. (2) and (3), $$A_p = \frac{a}{2} e^{j\Omega t}[e^{j\omega t}\{e^{-jm\theta} + e^{jm\theta}\} + e^{-j\omega t}\{e^{jm\theta} + e^{-jm\theta}\}] = \quad \text{Eq. (4)}$$
$$2ae^{j\Omega t}\cos(m\theta)\cos(\omega t)$$

$$A_q = \frac{a}{2} e^{j\Omega t}[e^{j\omega t}\{e^{-jm\theta}e^{j(m\theta_q+\varphi)} + e^{jm\theta}e^{j(-m\theta_q+\varphi)}\} + \quad \text{Eq. (5)}$$
$$e^{-j\omega t}\{e^{jm\theta}e^{j(-m\theta_q+\varphi)} + e^{-jm\theta}e^{j(m\theta_q+\varphi)}\}]$$

Hence, the resulting wave in the cavity is given by $$A_s = A_p + A_q = \quad \text{Eq. (6)}$$
$$\frac{a}{2} e^{j\Omega t} \cdot \{e^{j\omega t}[e^{-jm\theta}\{1 + e^{j(m\theta_q+\varphi)}\} + e^{jm\theta}\{1 + e^{j(-m\theta_q+\varphi)}\}] +$$
$$e^{-j\omega t}[e^{jm\theta}\{1 + e^{j(-m\theta_q+\varphi)}\} + e^{-jm\theta}\{1 + e^{j(m\theta_q+\varphi)}\}]\}$$

To provide an anti-clockwise rotation, the following condition must be satisfied:

$$e^{j(m\theta_q+\varphi)} = 1 \quad \text{Eq. (7)}$$

$$e^{j(-m\theta_q+\varphi)} = -1 \quad \text{Eq. (8)}$$

Or, equivalently, $$m\theta_q + \varphi = 2r\pi \quad \text{Eq. (9)}$$

$$-m\theta_q + \varphi = (2s+1)\pi \quad \text{Eq. (10)}$$

where r and s are arbitrary integers.

Solving Eqs. (9) and (10) simultaneously, the condition for the anti-clockwise rotation can be represented as $$\varphi_{ant} = \frac{2r + 2s + 1}{2}\pi \quad \text{Eq. (11)}$$

$$\theta_q = \frac{2r - (2s+1)}{2m}\pi \quad \text{Eq. (12)}$$

In the same manner, for a clockwise rotation, Eqs. (7) and (8) become $$e^{j(m\theta_q+\varphi)} = -1 \quad \text{Eq. (13)}$$

$$e^{j(-m\theta_q+\varphi)} = 1 \quad \text{Eq. (14)}$$

and Eqs. (9) and (10) become $$m\theta_q + \varphi = (2r+1)\pi \quad \text{Eq. (15)}$$

$$-m\theta_q + \varphi = (2s+2)\pi \quad \text{Eq. (16)}$$

Solving Eqs. (15) and (16) simultaneously, the condition for the clockwise rotation can be represented as $$\varphi_{clk} = \frac{2r + 2s + 1}{2}\pi + \pi \quad \text{Eq. (17)}$$

$$\theta_q = \frac{2r - (2s+1)}{2m}\pi \quad \text{Eq. (18)}$$

Comparing Eqs. (11) & (12) with (17) & (18), the angle $\theta_q$ of Port Q has the identical form, whereas the temporal phase delays ($\varphi_{ant}$ and $\varphi_{clk}$) are different by π between the anti-clockwise and clockwise rotations.

Explicitly, Eqs. (11)&(12), (17) &(18) can be solved as
First case: r=1, s=0

$$\varphi_{ant} = \frac{3\pi}{2} \equiv -\frac{\pi}{2} \quad \text{Eq. (19)}$$

$$\varphi_{clk} \equiv \frac{\pi}{2}$$

$$\theta_q = \frac{1}{2m}\pi$$

Second case: r=2, s=0

$$\varphi_{ant} = \frac{5\pi}{2} \equiv \frac{\pi}{2} \quad \text{Eq. (20)}$$

$$\varphi_{clk} \equiv -\frac{\pi}{2}$$

$$\theta_q = \frac{3}{2m}\pi$$

Going back to the case of the anticlockwise rotation, the resultant field of Eq. (6) may be represented in the complex form as $$A_s = ae^{j(\Omega t - m\theta)}[e^{j\omega t} + e^{-j\omega t}] = 2e^{j(\Omega t - m\theta)}\cos(\omega t) \quad \text{Eq. (21)}$$

and in the real form, as $$A_s = 2a \cos(\omega t - m\theta)\cos(\omega t) \quad \text{Eq. (22)}$$

which imply that the resulting wave slowly rotates in the anti-clockwise direction with an angular frequency of $$\frac{\Omega}{m}.$$

Eqs. (4) and (5) can be represented under the anticlockwise rotation, $$A_p = 2ae^{j\Omega t} \cos(m\theta)\cos(\omega t)$$

$$A_q = -2jae^{j\Omega t} \sin(m\theta)\cos(\omega t) \qquad \text{Eq. (23)}$$

In the real forms $$A_p = 2a \cos(\Omega t)\cos(m\theta_p)\cos(\omega t)$$

$$A_q = 2a \sin(\Omega t)\sin(m\theta_q)\cos(\omega t) \qquad \text{Eq. (24)}$$

To derive the input wave forms in Ports P and Q, the coordinates of P and Q must be substituted into θ as $$A_p(\theta=\theta_p) = 2a \cos(\Omega t)\cos(m\theta_p)\cos(\omega t)$$

$$A_q(\theta=\theta_q) = 2a \sin(\Omega t)\sin(m\theta_q)\cos(\omega t) \qquad \text{Eq. (25-1)}$$

Equations (25-1) provide the general form of the input wave forms at Ports P and Q in the case of $$\varphi_{ant} \equiv \frac{\pi}{2} \text{(anticlockwise rotation)}.$$

In the case of Eqs. (20), i.e. $\theta_p = 0$ and $$\text{eq. (7)}: \theta_q = \frac{3}{2m}\pi,$$

Eq. (25-1) becomes $$A_p(\theta=\theta_p) = 2a \cos(\Omega t)\cos(\omega t)$$

$$A_q(\theta=\theta_q) = -2a \sin(\Omega t)\cos(\omega t) \qquad \text{Eq. (25-2)}$$

Equations (25-2) provide the input wave forms at Ports P and Q in the case of $$\varphi_{ant} \equiv \frac{\pi}{2} \text{(anticlockwise rotation) and } \theta_q = \frac{3}{2m}\pi.$$

The equations for the clockwise rotation corresponding to Eqs. (21) to (25-2) are represented, respectively, by $$A_s = ae^{j(\Omega t+m\theta)}[e^{j\omega t}+e^{-j\omega t}] = 2e^{j(\Omega t+m\theta)}\cos(\omega t) \qquad \text{Eq. (26)}$$

$$A_s = 2a \cos(\Omega t+m\theta)\cos(\omega t) \qquad \text{Eq. (27)}$$

$$A_p = 2ae^{j\Omega t} \cos(m\theta)\cos(\omega t)$$

$$A_q = 2jae^{j\Omega t} \sin(m\theta)\cos(\omega t) \qquad \text{Eq. (28)}$$

$$A_p = 2a \cos(\Omega t)\cos(m\theta)\cos(\omega t)$$

$$A_q = -2a \sin(\Omega t)\sin(m\theta)\cos(\omega t) \qquad \text{Eq. (29)}$$

$$A_p(\theta=\theta_p) = 2a \cos(\Omega t)\cos(m\theta_p)\cos(\omega t)$$

$$A_q(\theta=\theta_q) = -2a \sin(\Omega t)\sin(m\theta q)\cos(\omega t) \qquad \text{Eq. (30-1)}$$

Equations (30-1) provide the general form of the input wave forms at Ports P and Q in the case of $$\varphi_{ant} \equiv -\frac{\pi}{2} \text{(clockwise rotation)}.$$

In the case of Eqs. (20), i.e. $\theta_p = 0$ and $$\text{eq. (7)}: \theta_q = \frac{3}{2m}\pi$$

$$A_p(\theta=\theta_p) = 2a \cos(\Omega t)\cos(\omega t)$$

$$A_q(\theta=\theta_q) = 2a \sin(\Omega t)\cos(\omega t) \qquad \text{Eq. (30-2)}$$

Equations (30-2) provide the input wave forms at Ports P and Q in the case of $$\varphi_{clk} \equiv -\frac{\pi}{2} \text{(clockwise rotation) and } \theta_q = \frac{3}{2m}\pi.$$

The derivations above can be used as a basis for providing input to electronics sets, so that a given wave pattern within a microwave cavity can be rotated over time. For example, it may be desired to transmit microwaves of frequency co, and rotate a resulting wave pattern with an angular frequency of Ω. Referring to FIG. 3, the relative positions P and Q where electromagnetic radiation is delivered from electronics sets 225(1) and 225(2) are known. Signal generator 215 may be preprogrammed to select ω and/or Ω, or they may be entered as a matter of user preference using user input device 314. With all of these parameters known, signal generator 215 calculates $A_p$ and $A_q$ according to Equations 25-2 if the rotation should be in the anticlockwise direction, or according to Equations 30-2 if the rotation should be in the anticlockwise direction, and provides input signals 220 (1) and 220(2) according to the calculated $A_p$ and $A_q$.

Certain uniformity issues may also be addressed by exciting different radial eigenmodes within a microwave cavity, as opposed to the vertical eigenmodes discussed above, in order to alter radial plasma characteristics. For example, suppose that characterization shows that a region like region 588, FIG. 13, is found to exist. Region 588 is not centered within workpiece 50, but is more or less between its center and edge. It is difficult to remove the nonuniformity causing region 588 with conventional microwave sources.

Figure 15:
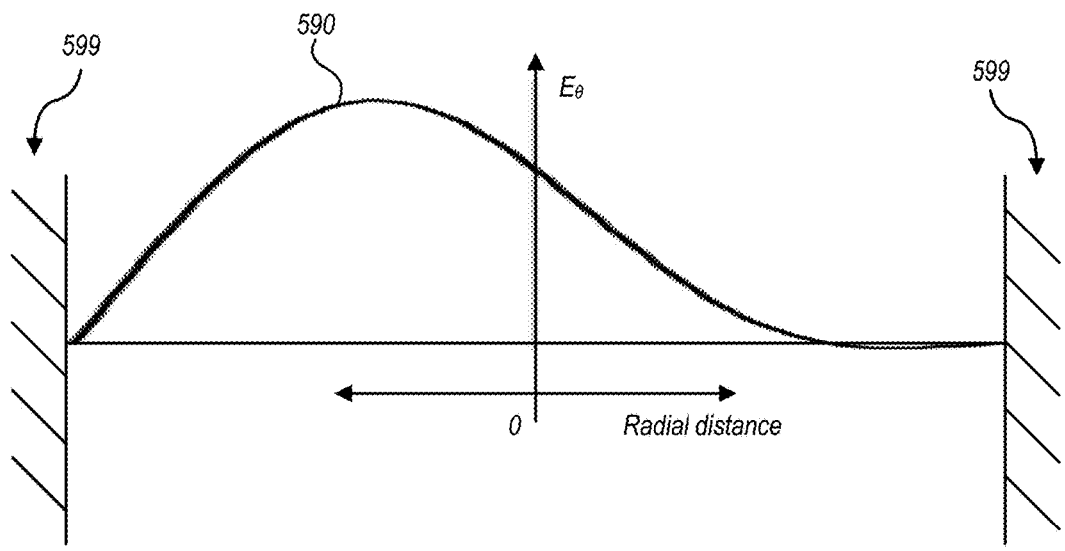
FIG. 15 illustrates certain radial eigenmodes that can be excited within a chamber having chamber walls, according to an embodiment.
Figure 16:
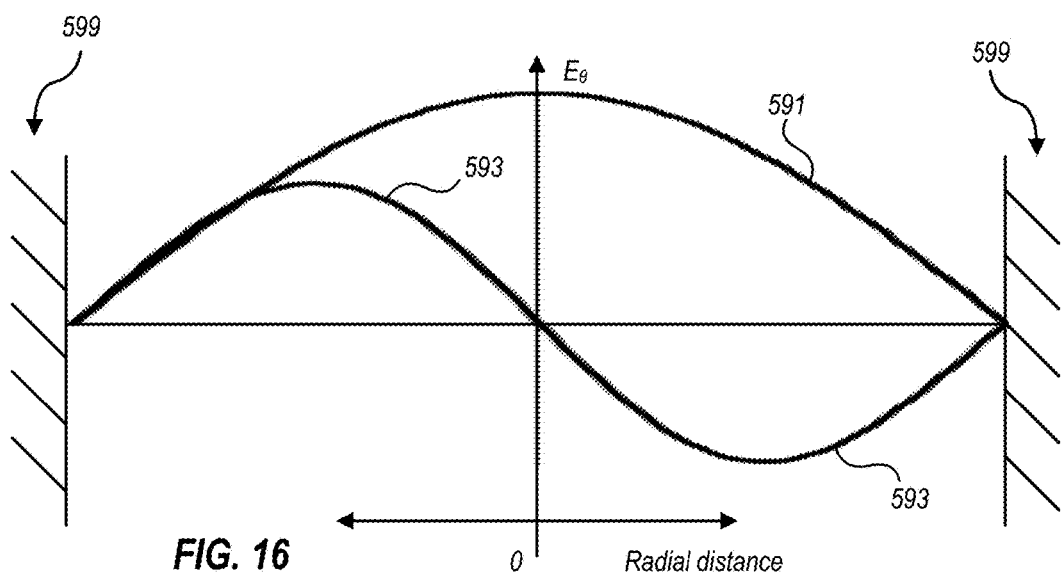
FIG. 16 illustrates locations of peak electric field strengths corresponding to each of the eigenmodes illustrated in FIG. 15.

A new proposal to remove the nonuniformity is to generate plasma 60 using an electric field 590 as illustrated in FIG. 15, having an asymmetrical, edge-high profile. A distribution of plasma 60 will be determined by a square of the electric field at a given location. The field illustrated in FIG. 15 can be made by superimposing a first TE mode, such as $TE_{111}$ mode 591, on a second TE mode of a different order, such as $TE_{011}$ mode 591, as shown in FIG. 16. Only an azimuthal component of electric field $E_\theta$ is considered, because the radial component of $TE_{011}$ mode 591 is always zero. This can lead to the resonant frequencies of the $TE_{111}$ mode 591 and the $TE_{011}$ mode 593 being slightly different. For example, for a specific cavity of around 400 mm diameter, the resonant frequency of $$TE_{111} \text{ mode } 593 = \frac{\omega_{111}}{2\pi} = 2.431 \text{ GHz},$$

while for the same cavity, the resonant frequency of $$TE_{011} \text{ mode } 591 = \frac{\omega_{011}}{2\pi} = 2.467 \text{ GHz}.$$

Therefore, over time, the shape of the resultant field 590 (FIG. 15) will change. To avoid this, the phase difference between electromagnetic radiation frequencies $\omega_{111}$ and $\omega_{011}$ must be periodically reset to zero.

Different order TE modes can also be supplied with slow rotation as discussed above. For example, input power for the $TE_{111}$ mode 591 may be injected at points P and Q (FIG. 3) in the forms, $$A_p = 2a \cos [\Omega(t)t] \cos \omega_{111} t$$

$$A_q = 2a \sin [\Omega(t)t] \cos \omega_{111} t \qquad \text{Eq. (31)}$$

producing anticlockwise rotation. The time dependent slow rotational angular frequency $\Omega$ can be assigned to alleviate the nonuniformity. However, power injection for the $TE_{011}$ mode 593 has a degree of freedom, because $TE_{011}$ mode 593 is azimuthally symmetrical. One representative form of providing input power for the $TE_{011}$ mode 593 is to use the forms, $$B_p = 2b \cos \omega_{011} t$$

$$B_q = 2b \cos \omega_{011} t. \qquad \text{Eq. (32)}$$

Time dependent assignment of $\Omega$ can be implemented by signal generator 215. In general, frequency differences between different order modes such as $TE_{11X}$ and $TE_{01X}$, where x=1 or 2, span about 30 to 140 MHz, depending on the size of a chamber being powered. Capable computer processing hardware such as microprocessors or FPGAs can be implemented within signal generator 215, to determine and reset the temporal phases of such modes relative to one another.

Figure 21A:
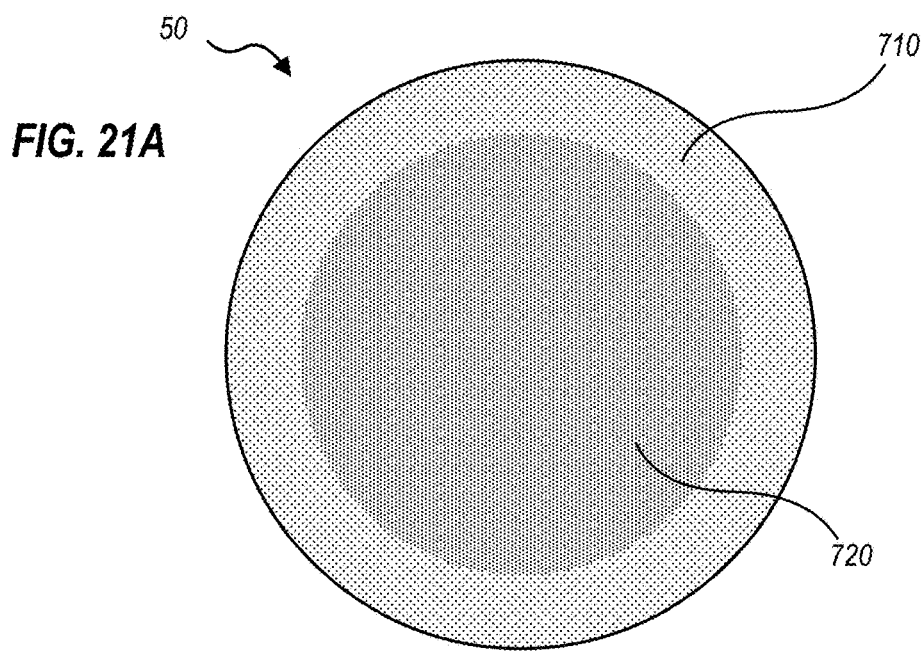
FIG. 21A illustrates workpiece after processing with a nominal plasma process that produces a different result in an outer region than in an inner region, according to an embodiment.
Figure 21B:
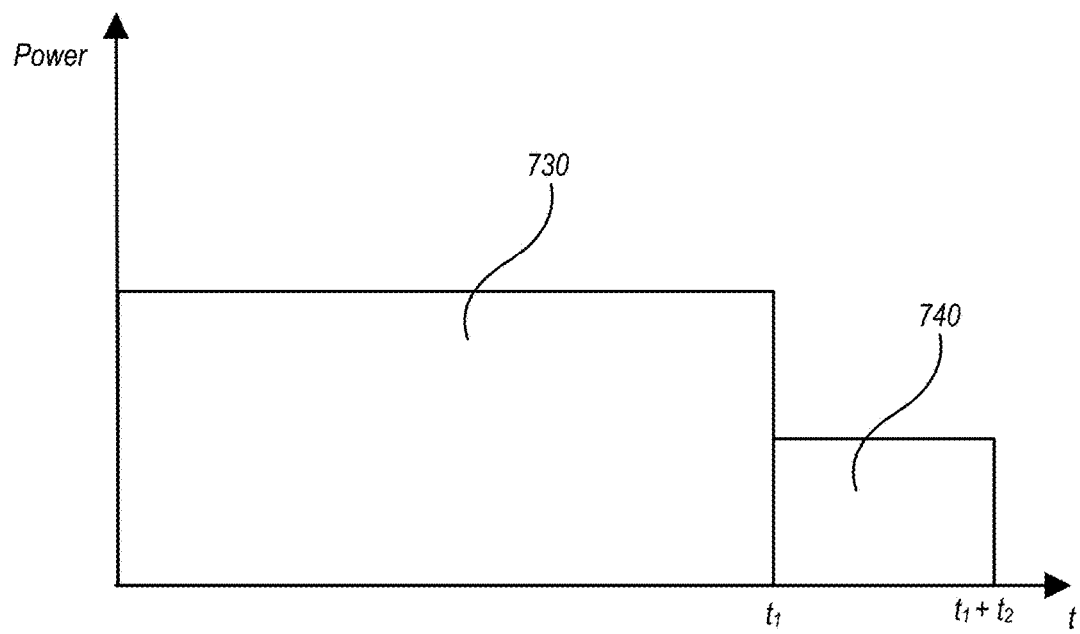
FIG. 21B schematically illustrates a program that implements a process strategy, where a first process segment proceeds at a nominal power, and thereafter a second process segment continues through an additional time increment, according to an embodiment.

The strategy discussed immediately above is also applicable in situations where equipment capabilities or other process constraints cause simple radial processing nonuniformity. For example, FIG. 21A illustrates workpiece 50 after processing with a nominal plasma process that produces a different result in an outer region 710 than in an inner region 720. In the case of an etch process, region 720 might experience a nominal etch while region 710 experiences a reduced etch, but this scenario could also be inverted or be applied to another process type (e.g., a deposition process). If the nominal process is provided with a plasma excited by a $TE_{011}$ mode with an etch time of t1, an extra etch time t2 can be added to the process in which etching is provided with a plasma excited by an edge-high mode such as $TE_{211}$. Like the process strategies above, this is easily implemented through electronic means only, that is, signal generator 215 can provide appropriate frequency, phase and/or amplitude variations to provide the $TE_{011}$, $TE_{211}$ and/or other modes. No mechanical equipment changes are required. FIG. 21B schematically illustrates a program that implements this strategy, where a first process segment 730 (e.g., a nominal etch process using a $TE_{011}$ mode) proceeds at a nominal power until time t1, and thereafter a second process segment 740 (e.g., a custom, edge-high etch process using a $TE_{211}$ and/or other mode) continues through a time increment t2. Plasma power is shown as reduced in segment 740 as compared with segment 730, but this need not be the case, power could be equivalent or even greater in segment 740 than segment 730. Further process segments could also be added. One of ordinary skill in the art will readily recognize alternatives, equivalents, modifications, extensions, and intermediate combinations of this technique.

Chamber geometry and/or configuration can also make implementation of slow rotation and/or multiple order TE modes challenging, especially when the same frequency must resonate in two different cavities (e.g., as in systems 500, 550 and 560, FIGS. 10, 11 and 12). One way to address this challenge is to design one or both of the resonant cavities with a low quality factor, such that the resonance peak is less pronounced in amplitude, but wider in terms of frequency.

Figure 17:
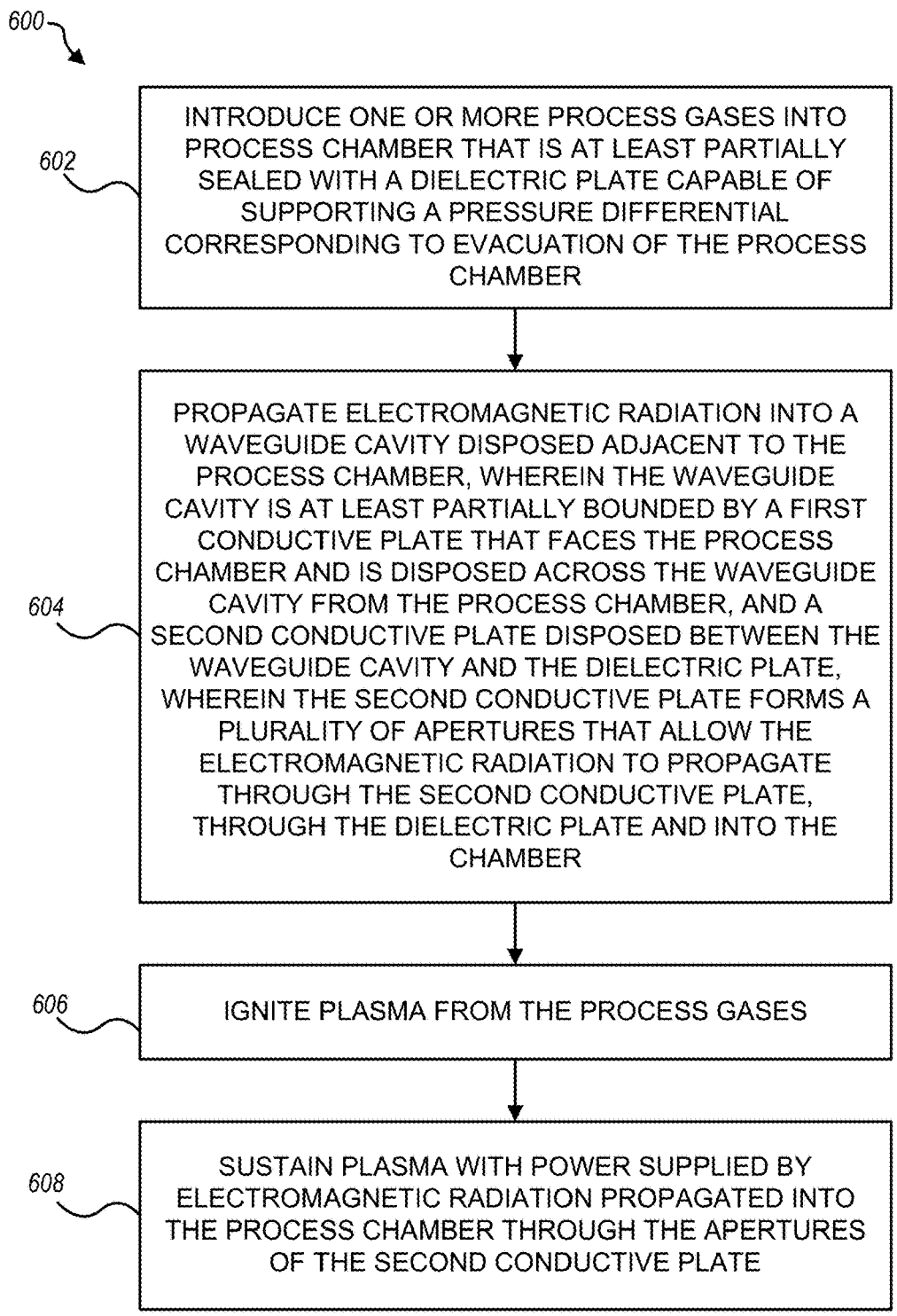
FIG. 17 is a flowchart of a method that generates a plasma for processing a workpiece, according to an embodiment.

FIG. 17 is a flowchart of a method 600 that generates a plasma for processing a workpiece. Method 600 can be implemented using one or more of systems 100, 400, 500, 550 and 560 disclosed herein. A first step 602 of method 600 introduces one or more process gases into a process chamber (e.g., process chamber 130 or 430). The process chamber is at least partially sealed with a dielectric plate (e.g., dielectric plates 169, 469, 520) capable of supporting a pressure differential corresponding to evacuation of the process chamber. A second step 604 of method 600 propagates electromagnetic radiation (e.g., from electronics sets 225(2), 225(2)) into a waveguide cavity (e.g., cavity 167 or 467) that is disposed adjacent to the process chamber. The waveguide cavity is at least partially bounded by a first conductive plate (e.g., conductive plate 420) that faces the process chamber and is disposed across the waveguide cavity from the process chamber. The cavity is also at least partially bounded by a second conductive plate (e.g., plate 437) disposed between the waveguide cavity and the dielectric plate. The second conductive plate forms a plurality of apertures (e.g., slots 168) that allow the electromagnetic radiation to propagate through the second conductive plate, through the dielectric plate and into the chamber. A third step 606 ignites the plasma from the process gases. A fourth step 608 sustains the plasma with power supplied by the electromagnetic radiation propagated into the process chamber through the apertures of the second conductive plate.

Method 600 may be varied so as to use any of the equipment variations disclosed herein, where they are compatible with steps 602 through 608 as listed. One of ordinary skill in the art, upon reading and comprehending the present disclosure, will be able to practice not only method 600 as specifically listed, but will readily recognize alternatives, equivalents, modifications, extensions, and intermediate combinations of the disclosed steps based on the concepts and equipment capabilities disclosed herein.

Figure 18:
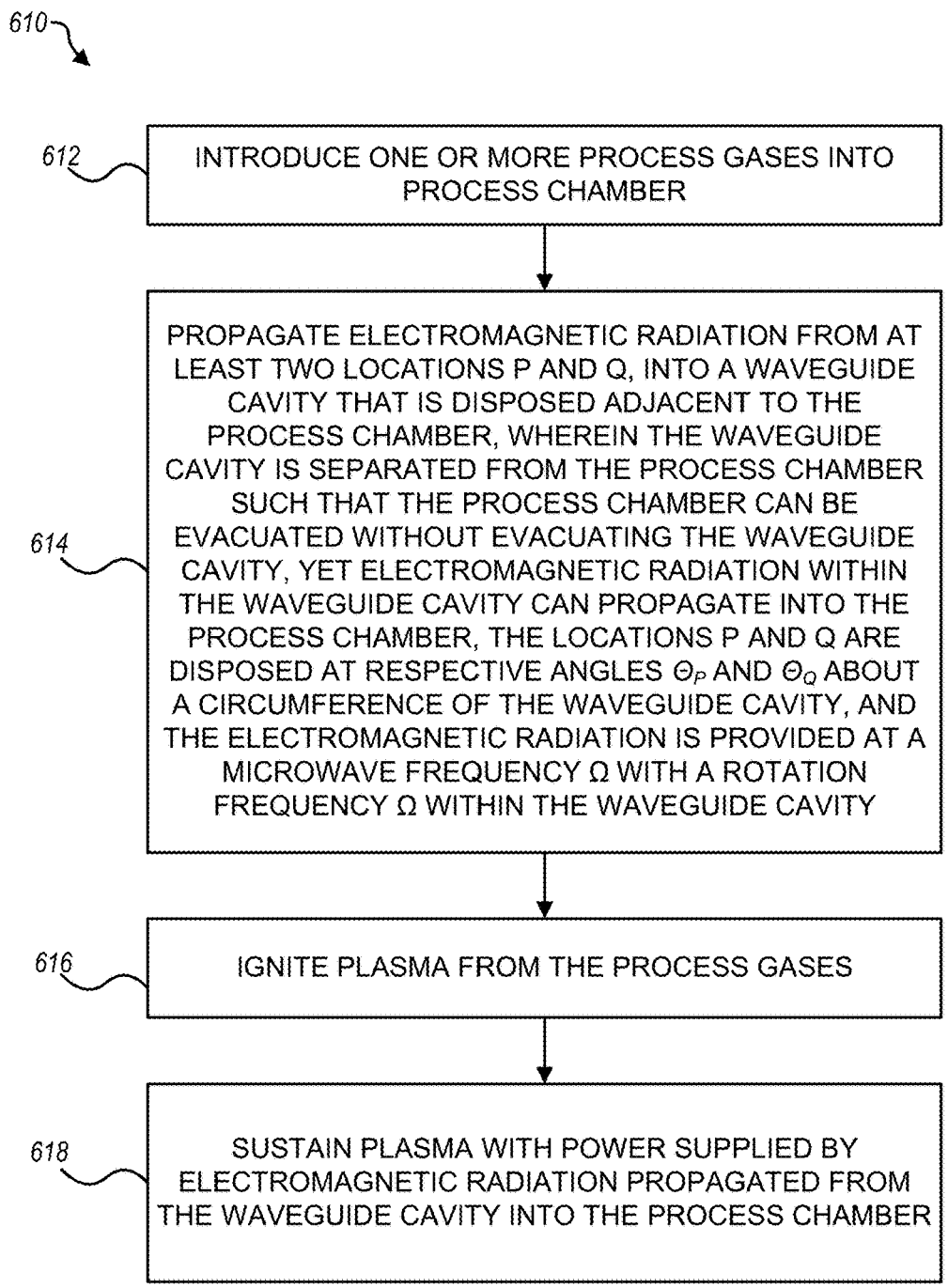
FIG. 18 is a flowchart of a method that provides electromagnetic radiation for powering a plasma in a process chamber, according to an embodiment.

FIG. 18 is a flowchart of a method 610 that provides electromagnetic radiation for powering a plasma in a process chamber. Method 610 can be implemented using one or more of systems 100, 400, 470, 480, 490, 500, 550 and 560 disclosed herein. A first step 612 of method 600 introduces one or more process gases into a process chamber (e.g., process chamber 130 or 430). A second step 614 of method 610 propagates electromagnetic radiation (e.g., from electronics sets 225(2), 225(2)) from at least two locations P and Q (FIG. 4), into a waveguide cavity (e.g., cavity 167 or 467) that is disposed adjacent to the process chamber. The waveguide cavity is separated from the process chamber (e.g., by a dielectric plate, such as dielectric plates 169, 469, 520) such that the process chamber can be evacuated without evacuating the waveguide cavity, yet electromagnetic radiation within the waveguide cavity can propagate into the process chamber. The locations P and Q are disposed at respective angles $\theta_p$ and $\theta_q$ about a circumference of the waveguide cavity (FIG. 4), and the electromagnetic radiation is provided at a microwave frequency ω with a rotation frequency Ω2 within the waveguide cavity (Equations 1-32). A third step 616 ignites the plasma from the process gases. A fourth step 618 sustains the plasma with power supplied by the electromagnetic radiation propagated from the waveguide into the process chamber.

Method 610 may be varied so as to use any of the equipment variations disclosed herein, where they are compatible with steps 612 through 618 as listed. One of ordinary skill in the art, upon reading and comprehending the present disclosure, will be able to practice not only method 610 as specifically listed, but will readily recognize alternatives, equivalents, modifications, extensions, and intermediate combinations of the disclosed steps based on the concepts and equipment capabilities disclosed herein.

Figure 19:
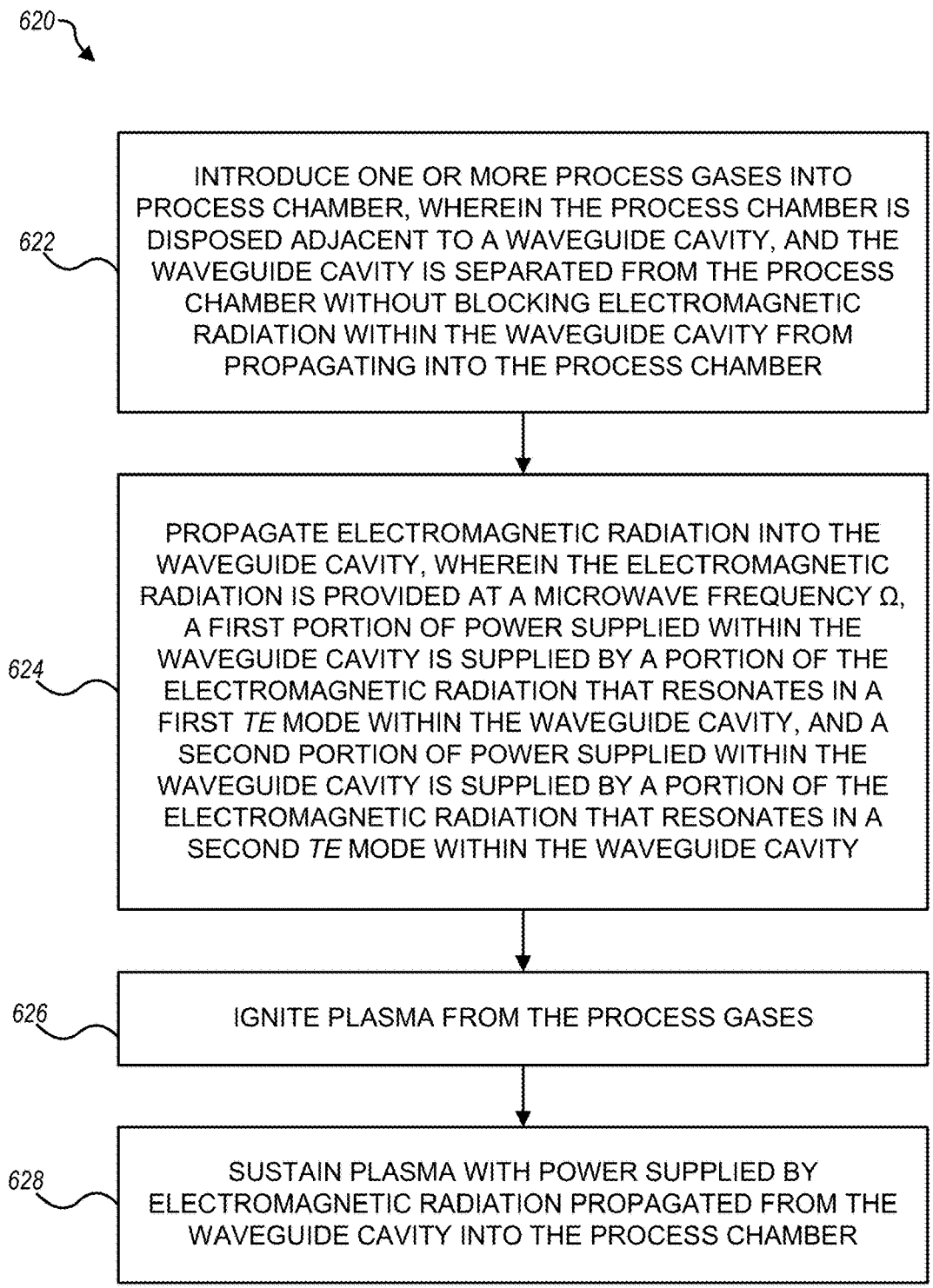
FIG. 19 is a flowchart of a method for plasma processing in a process chamber, according to an embodiment.

FIG. 19 is a flowchart of a method 620 for plasma processing in a process chamber. Method 620 can be implemented using one or more of systems 100, 400, 470, 480, 490, 500, 550 and 560 disclosed herein. A first step 622 of method 620 introduces one or more process gases into a process chamber (e.g., process chamber 130 or 430). The process chamber is disposed adjacent to a waveguide cavity (e.g., cavity 167 or 467), and the waveguide cavity is separated from the process chamber without blocking electromagnetic radiation within the waveguide cavity from propagating into the process chamber (e.g., by a dielectric plate, such as dielectric plates 169, 469, 520). A second step 624 of method 620 propagates electromagnetic radiation into the waveguide cavity (e.g., from electronics sets 225(2), 225(2)). The electromagnetic radiation is provided at a microwave frequency co. A first portion of power supplied within the waveguide cavity is supplied by a portion of the electromagnetic radiation that resonates in a first TE mode within the waveguide cavity, and a second portion of power supplied within the waveguide cavity is supplied by a portion of the electromagnetic radiation that resonates in a second TE mode within the waveguide cavity (FIGS. 15, 16). A third step 626 ignites the plasma from the process gases. A fourth step 628 sustains the plasma with power supplied by the electromagnetic radiation propagated from the waveguide into the process chamber.

Method 620 may be varied so as to use any of the equipment variations disclosed herein, where they are compatible with steps 622 through 628 as listed. One of ordinary skill in the art, upon reading and comprehending the present disclosure, will be able to practice not only method 620 as specifically listed, but will readily recognize alternatives, equivalents, modifications, extensions, and intermediate combinations of the disclosed steps based on the concepts and equipment capabilities disclosed herein.

Figure 20:
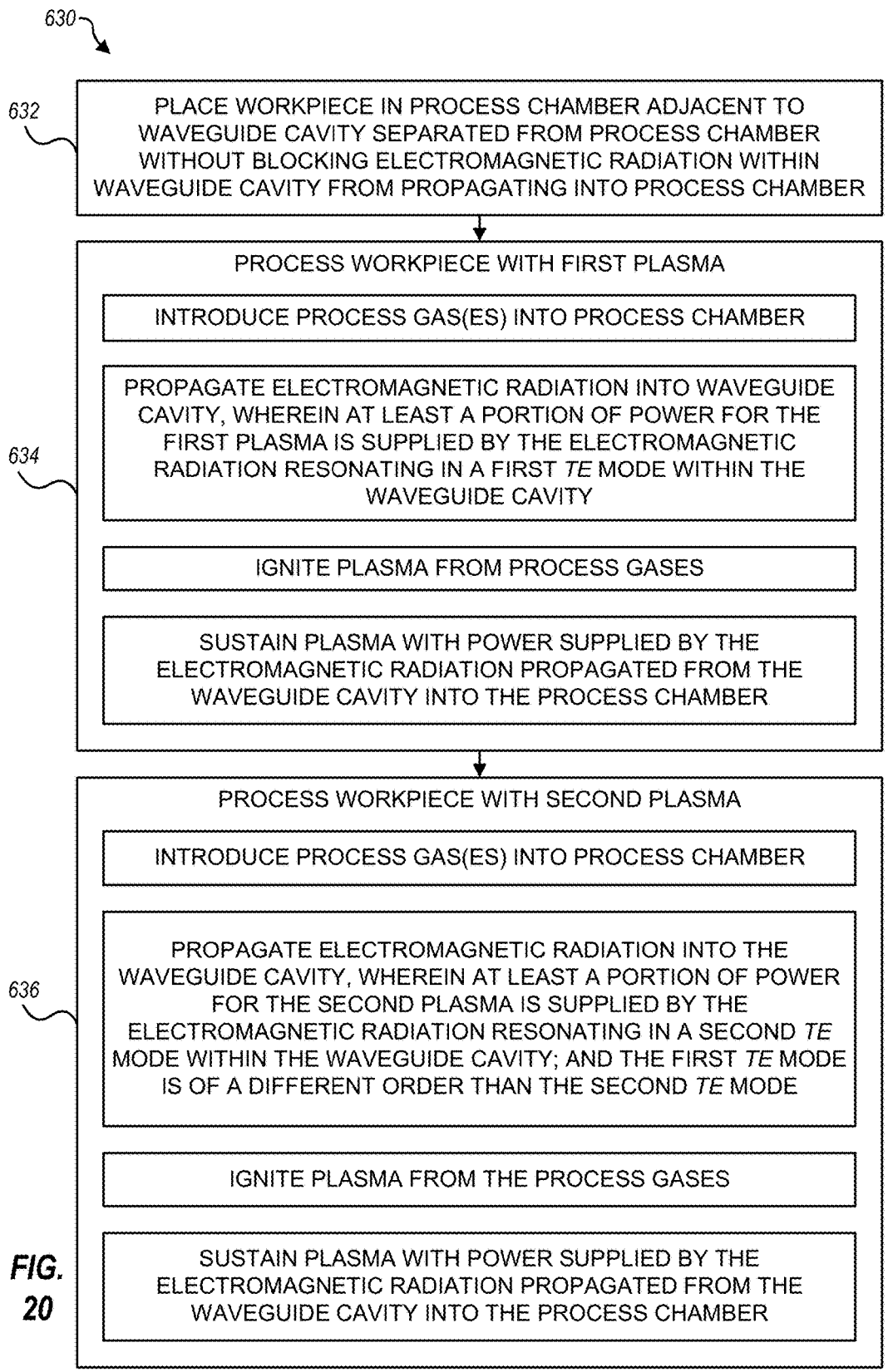
FIG. 20 is a flowchart of a method 630 for processing a workpiece in a process chamber, according to an embodiment.

FIG. 20 is a flowchart of a method 630 for processing a workpiece in a process chamber. Method 630 can be implemented using one or more of systems 100, 400, 470, 480, 490, 500, 550 and 560 disclosed herein. A first step 622 of method 620 places the workpiece in the process chamber (e.g., process chamber 130 or 430). The process chamber is disposed adjacent to a waveguide cavity (e.g., cavity 167 or 467), and the waveguide cavity is separated from the process chamber without blocking electromagnetic radiation within the waveguide cavity from propagating into the process chamber. A second step 634 of method 630 processes the workpiece, in the process chamber, with a first plasma (e.g., plasma 60). Step 634 includes introducing one or more process gases into the process chamber, propagating electromagnetic radiation into the waveguide cavity (e.g., from electronics sets 225(2), 225(2)), igniting the plasma from the process gases, and sustaining the plasma with power supplied by the electromagnetic radiation propagated from the waveguide cavity into the process chamber. At least a portion of power for the first plasma is supplied by the electromagnetic radiation resonating in a first TE mode within the waveguide cavity. A third step 636 of method 630 processes the workpiece, in the process chamber, with a second plasma (e.g., plasma 60). Step 636 includes introducing one or more process gases into the process chamber, propagating electromagnetic radiation into the waveguide cavity (e.g., from electronics sets 225(2), 225(2)), igniting the plasma from the process gases, and sustaining the plasma with power supplied by the electromagnetic radiation propagated from the waveguide cavity into the process chamber. At least a portion of power for the first plasma is supplied by the electromagnetic radiation resonating in a second TE mode within the waveguide cavity. The first TE mode is of a different order than the second TE mode.

Method 630 may be varied so as to use any of the equipment variations disclosed herein, where they are compatible with steps 632 through 636 as listed. One of ordinary skill in the art, upon reading and comprehending the present disclosure, will be able to practice not only method 630 as specifically listed, but will readily recognize alternatives, equivalents, modifications, extensions, and intermediate combinations of the disclosed steps based on the concepts and equipment capabilities disclosed herein.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A system that generates a plasma for processing a workpiece, comprising:
   a process chamber that is operable to be evacuated;
   a housing that defines a waveguide cavity;

a first conductive plate disposed within the housing, wherein the first conductive plate faces the process chamber and is disposed on a distal side of the waveguide cavity from the process chamber;

one or more adjustment devices that couple with the first conductive plate and the housing, wherein the one or more adjustment devices are operable to adjust at least a position of the first conductive plate within a range of positions;

a second conductive plate, coupled with the housing and interposed between the waveguide cavity and the process chamber, the second conductive plate forming a plurality of apertures therein for allowing electromagnetic radiation within the waveguide cavity to propagate, through the apertures, into the process chamber;

a dielectric plate that seals off the process chamber from the waveguide cavity such that the waveguide cavity is not evacuated when the process chamber is evacuated; and one or more electronics sets that transmit the electromagnetic radiation into the waveguide cavity, such that the plasma forms when at least one process gas is within the process chamber, and the electromagnetic radiation propagates into the process chamber from the waveguide cavity.

2. The system of claim 1, wherein the waveguide cavity is capable of supporting an eigenmode when the first conductive plate is adjusted to an eigenmode position within the range of positions, and the one or more electronics sets transmit the electromagnetic radiation into the waveguide cavity.

3. The system of claim 1, wherein the process chamber is disposed within the housing.

4. The system of claim 1, wherein the one or more adjustment devices consist of three of the adjustment devices, such that adjusting the three adjustment devices adjusts both the position of the first conductive plate within the range of positions, and a tilt of the first conductive plate relative to the housing.

5. The system of claim 1, further comprising one or more conductive bellows in one to one correspondence with the one or more adjustment devices, wherein each of the one or more conductive bellows surrounds its respective adjustment device, and electrically connects the first conductive plate with the housing.

6. The system of claim 1, wherein each of the one or more adjustment devices comprises a threaded rod, a geared device, a magnetic actuator, a stepper motor, or a piezoelectric actuator coupled with the first conductive plate.

7. The system of claim 1, further comprising an RF gasket or an RF choke disposed with the first conductive plate, to reduce microwave leakage through a gap between the first conductive plate and the housing.

8. The system of claim 1, further comprising an RF choke disposed with the first conductive plate, to reduce microwave leakage through a gap between the first conductive plate and the housing, wherein the RF choke includes:

a conductive holder disposed about a periphery of the first conductive plate, on a side of the first conductive plate that faces away from the second conductive plate; and a dielectric material, secured by the conductive holder against the first conductive plate, wherein the dielectric material has a lateral dimension $$L1 = \frac{m\lambda}{2\sqrt{\varepsilon_1}},$$

where $\varepsilon_1$ is a dielectric constant of the dielectric material, $\lambda$ is the wavelength of the electromagnetic radiation, and m is any integer greater than zero.

9. The system of claim 1, wherein each of the one or more electronics sets matches its driving impedance to an impedance presented by the waveguide cavity to the electromagnetic radiation.

10. The system of claim 1, further comprising a signal generator that provides at least:

a first microwave signal to a first electronics set of the one or more electronics sets, and a second microwave signal to a second electronics set of the one or more electronics sets;

and wherein:

the first and second microwave signals have a common frequency; and the first and second electronics sets amplify the first and second microwave signals, respectively, to provide the electromagnetic radiation.

11. The system of claim 10, further comprising:

at least two monitoring antennas, wherein each of the monitoring antennas is disposed at least 30 degrees away, about a circumference of the waveguide cavity, from locations at which the first and second electronics sets transmit the electromagnetic radiation into the waveguide cavity; and a signal controller that:

receives analog signals from the at least two monitoring antennas;

determines a digital correction signal based at least on the analog signals from the at least two monitoring antennas; and transmits the digital correction signal to the signal generator;

wherein the signal generator adjusts at least one of a phase and an amplitude of the first and second microwave signals in response to the digital correction signal.

12. The system of claim 11, wherein the first electronics set includes:

a tuner that matches a driving impedance of the first electronics set to an impedance presented by the waveguide cavity;

a dummy load; and a circulator that shunts any power reflected back from the waveguide cavity to the first electronics set, into the dummy load;

wherein the signal generator adjusts the at least one of the phase and the amplitude of the first and second microwave signals, and the tuner matches the driving impedance, concurrently with one another.

13. The system of claim 10, wherein the signal generator adjusts the common frequency so as to support an eigenmode within the dielectric plate.

14. The system of claim 1, wherein the second conductive plate is adjacent to, and in direct contact with, the dielectric plate.

15. The system of claim 1, wherein the second conductive plate is parallel with the dielectric plate, with a gap between the second conductive plate and the dielectric plate.

16. The system of claim 15, further comprising a signal generator that provides at least:

a first microwave signal to a first electronics set of the one or more electronics sets, and a second microwave signal to a second electronics set of the one or more electronics sets, the first and second microwave signals having a common frequency;

wherein each of the first and second electronics sets amplifies the first and second microwave signals, respectively, to provide the electromagnetic radiation; and the signal generator adjusts the common frequency so as to support an eigenmode within a cavity formed by the gap and the dielectric plate.

17. The system of claim 15, further comprising:
an adjustable dielectric layer comprising a liquid dielectric, disposed within the gap, for adjusting an eigenmode condition within a cavity formed by the gap, the adjustable dielectric layer and the dielectric plate; and
a controller configured to add or remove portions of the liquid dielectric so as to adjust a thickness of the adjustable dielectric layer.

18. The system of claim 15, wherein the housing is an upper housing, and further comprising:
a lower housing that includes the process chamber, wherein the dielectric plate is coupled with the lower housing; and
an actuator that is operable to adjust relative position of the upper housing relative to the lower housing;
wherein adjusting the relative position of the upper housing relative to the lower housing results in adjusting distance of the gap between the second conductive plate and the dielectric plate, to support an eigenmode of the electromagnetic radiation within a cavity formed by the gap and the dielectric plate.

19. A plasma processing system, comprising:
a process chamber that is operable to be evacuated;
one or more process gas supplies for introducing one or more process gases into the process chamber;
a housing that defines a waveguide cavity;
one or more electronics sets operable to transmit electromagnetic radiation into the waveguide cavity, wherein each of the one or more electronics sets matches its driving impedance to an impedance presented by the waveguide cavity to the electromagnetic radiation;
a first conductive plate, disposed within the housing and on a distal side of the waveguide cavity from the process chamber;
at least three adjustment devices that couple with the first conductive plate and the housing, wherein the at least three adjustment devices are operable to adjust at least a position of the first conductive plate within a range of positions, and a tilt of the first conductive plate with respect to the housing;
a second conductive plate, coupled with the housing and interposed between the waveguide cavity and the process chamber, the second conductive plate forming a plurality of apertures therein for allowing the electromagnetic radiation within the waveguide cavity to propagate, through the apertures, into the process chamber; and
a dielectric plate that seals off the process chamber from the waveguide cavity such that the waveguide cavity is not evacuated when the process chamber is evacuated;
wherein:
the waveguide cavity is capable of supporting an eigenmode between the first and second conductive plates when the first conductive plate is adjusted to an eigenmode position within the range of positions, and the one or more electronics sets transmit the electromagnetic radiation into the waveguide cavity; and
a plasma forms when at least one of the one or more process gases is within the process chamber, and the electromagnetic radiation propagates into the process chamber from the waveguide cavity.

20. The plasma processing system of claim 19, further comprising a signal generator that provides at least:
a first microwave signal to a first electronics set of the one or more electronics sets, and
a second microwave signal to a second electronics set of the one or more electronics sets;
and wherein:
the first and second microwave signals have a common frequency;
the first and second electronics sets amplify the first and second microwave signals, respectively, to provide the electromagnetic radiation; and
each of the first and second electronics sets matches its respective driving impedance to an impedance presented by the waveguide cavity to the electromagnetic radiation.

* * * * *